(12) United States Patent
Fritz et al.

(10) Patent No.: US 12,038,490 B2
(45) Date of Patent: Jul. 16, 2024

(54) METHOD FOR RECORDING DIAGNOSTIC MEASUREMENT DATA OF A KNEE OF AN EXAMINATION OBJECT IN KNEE IMAGING BY A MAGNETIC RESONANCE DEVICE

(71) Applicants: Siemens Healthineers AG, Erlangen (DE); The Johns Hopkins University, Baltimore, MD (US)

(72) Inventors: Jan Fritz, Baltimore, MD (US); Dingxin Wang, Apple Valley, MN (US); Esther Raithel, Dormitz (DE); Thomas Beck, Dormitz (DE); Flavio Carinci, Wuerzburg (DE); Mario Zeller, Erlangen (DE)

(73) Assignees: SIEMENS HEALTHINEERS AG, Forchheim (DE); THE JOHNS HOPKINS UNIVERSITY, Baltimore, MD (US)

( * ) Notice: Subject to any disclaimer, the term of this patent is extended or adjusted under 35 U.S.C. 154(b) by 656 days.

(21) Appl. No.: 17/272,759

(22) PCT Filed: Nov. 1, 2018

(86) PCT No.: PCT/US2018/058659
§ 371 (c)(1),
(2) Date: Mar. 2, 2021

(87) PCT Pub. No.: WO2020/068137
PCT Pub. Date: Apr. 2, 2020

(65) Prior Publication Data
US 2021/0231762 A1  Jul. 29, 2021

Related U.S. Application Data

(60) Provisional application No. 62/738,163, filed on Sep. 28, 2018.

(51) Int. Cl.
*G01R 33/54* (2006.01)
*G01R 33/48* (2006.01)
*G01R 33/561* (2006.01)

(52) U.S. Cl.
CPC ....... *G01R 33/4828* (2013.01); *G01R 33/543* (2013.01); *G01R 33/561* (2013.01)

(58) Field of Classification Search
CPC .......... G01R 33/543; G01R 33/561; G01R 33/4828; G01R 33/4816; G01R 33/246;
(Continued)

(56) References Cited

U.S. PATENT DOCUMENTS

2015/0253406 A1\* 9/2015 Nehrke ............... G01R 33/385
324/309
2017/0146625 A1\* 5/2017 Beck ................... G01R 33/4835
(Continued)

FOREIGN PATENT DOCUMENTS

EP    3373024 A1   9/2018

OTHER PUBLICATIONS

Fritz et al., "Three-Dimensional CAIPIRINHA SPACE TSE for 5-Minute High-Resolution MRI of the Knee" Investigative Radiology • vol. 51, No. 10, Oct. 2016, pp. 609-617 (Year: 2016).\*
(Continued)

*Primary Examiner* — Boniface N Nganga
(74) *Attorney, Agent, or Firm* — Harness, Dickey & Pierce, P.L.C.

(57) ABSTRACT

An embodiment of a method for recording diagnostic measurement data of a knee of an examination object in knee imaging by a magnetic resonance device, includes performing an overview scan of the knee of the examination object, wherein overview measurement data is acquired in the overview scan, and performing diagnostic scans of the knee of the examination object based on the acquired overview
(Continued)

measurement data, wherein two-dimensional diagnostic measurement data is acquired in the diagnostic scans.

21 Claims, 4 Drawing Sheets

(58) Field of Classification Search
CPC . G01R 33/50; G01R 33/5602; G01R 33/5608
See application file for complete search history.

(56) References Cited

U.S. PATENT DOCUMENTS

| | | |
|---|---|---|
| 2018/0140218 A1 | 5/2018 | Heberlein et al. |
| 2018/0260971 A1 | 9/2018 | Traverso et al. |

OTHER PUBLICATIONS

Breuer et al., Controlled Aliasing in Parallel Imaging Results in Higher Acceleration (CAIPIRINHA) MAGNETOM Flash Jan. 2012 www.siemems.com/magnetom-world (Year: 2012).*
Three-Dimensional CAIPIRINHA SPACE TSE for 5-Minute High-Resolution MRI of the Knee (Year: 2016).*
Controlled Aliasing in Parallel Imaging Results in Higher Acceleration (CAIPIRINHA) (Year: 2012).*
International Preliminary Report on Patentability dated Mar. 23, 2021.
Wang, Dingxin et al. "Improving Slice Resolution of Knee Imaging Using Multiband Slice Accelerated TSE" Proc. Intl. Soc. Mag. Reson. Med., ISMRM 2015.
Pruessmann, Klaas P. et al. "SENSE: Sensitivity encoding for fast MRI" Magnetic Resonance in Medicine, vol. 42, No. 5, pp. 952-962, Nov. 1999 (First published: Oct. 28, 1999) //https://doi.org/10.1002/(SICI)1522-2594(199911)42:5<952::AID-MRM16>3.0.CO;2-S.
Fritz, Jan et al. "Simultaneous Multislice Accelerated Turbo Spin Echo Magnetic Resonance Imaging: Comparison and Combination With In-Plane Parallel Imaging Acceleration for High-Resolution Magnetic Resonance Imaging of the Knee" Investigative Radiology, vol. 52, No. 9, pp. 529-537, Sep. 2017 // DOI: 10.1097/RLI.0000000000000376.
Barth, Markus et al. "Simultaneous Multislice (SMS) Imaging Techniques" Magnetic Resonance in Medicine, vol. 75, pp. 63-81, 2016 // DOI: 10.1002/mrm.25897.
Breuer, Felix A. et al. "Controlled Aliasing in Parallel Imaging Results in Higher Acceleration (CAIPIRINHA) for Multi-Slice Imaging" Magnetic Resonance in Medicine, vol. 53, No. 3, pp. 684-691, 2005 // DOI: 10.1002/mrm.20401.
Zhan, Yiqiang et al. "Robust Automatic Knee MR Slice Positioning through Redundant and Hierarchical Anatomy Detection", IEEE Trans. Med. Imaging, vol. 30, pp. 2087-2100, 2011 // DOI: 10.1109/TMI.2011.2162634.
Benali, Sebastien et al. "Simultaneous multi-slice accelerated turbo spin echo of the knee in pediatric patients" Skeletal Radiology, vol. 47, No. 6, pp. 821-831, Jun. 2018 // https://doi.org/10.1007/s00256-017-2868-2.
Griswold, Mark A. et al. "Generalized Autocalibrating Partially Parallel Acquisitions (GRAPPA)" Magnetic Resonance in Medicine, vol. 47, pp. 1202-1210, 2002 // DOI: DOI 10.1002/mrm.10171.
International Search Report PCT/ISA/210 and Written Opinion of the International Searching Authority PCT/ISA/237 for International Application No. PCT/US2018/058659 dated Nov. 1, 2018.

* cited by examiner

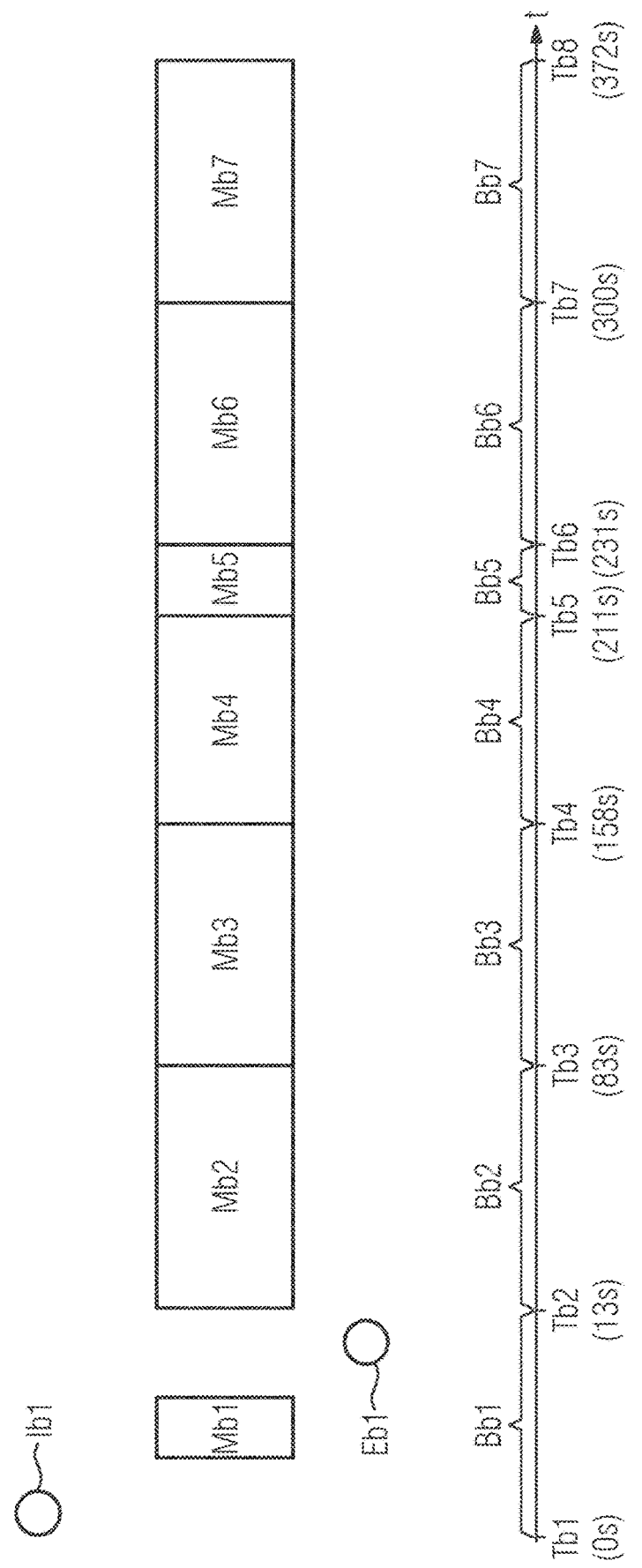

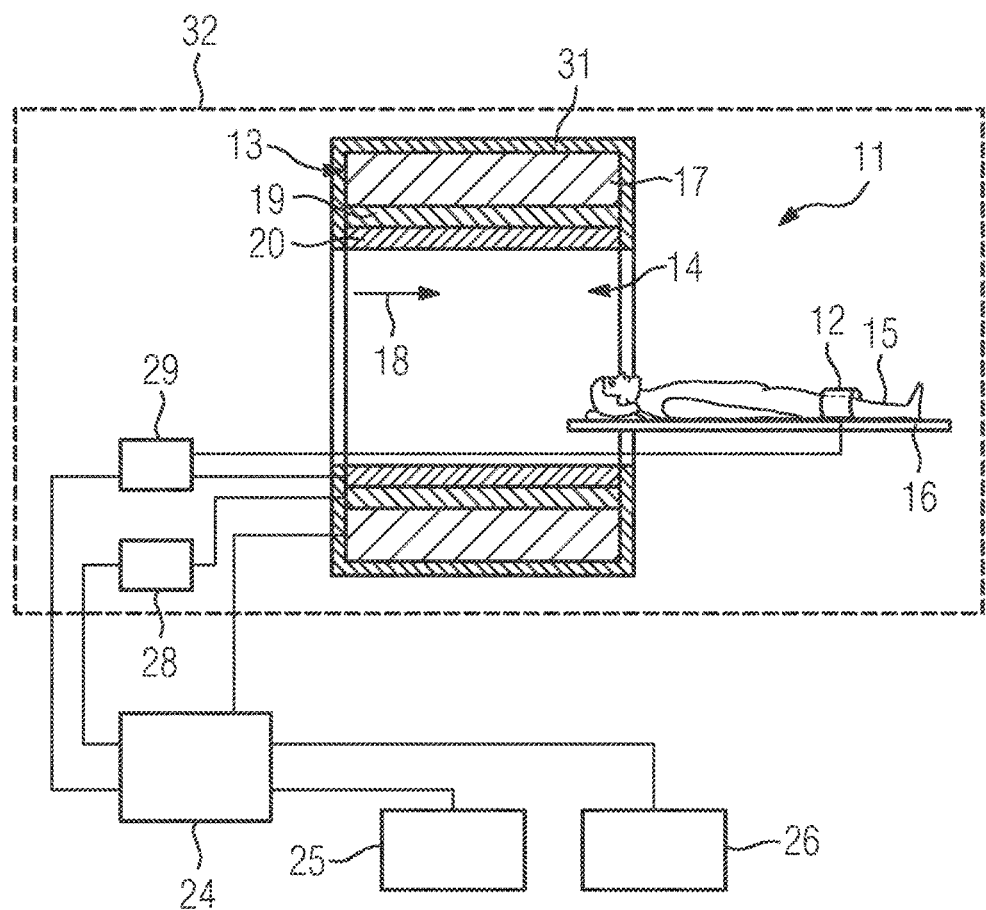

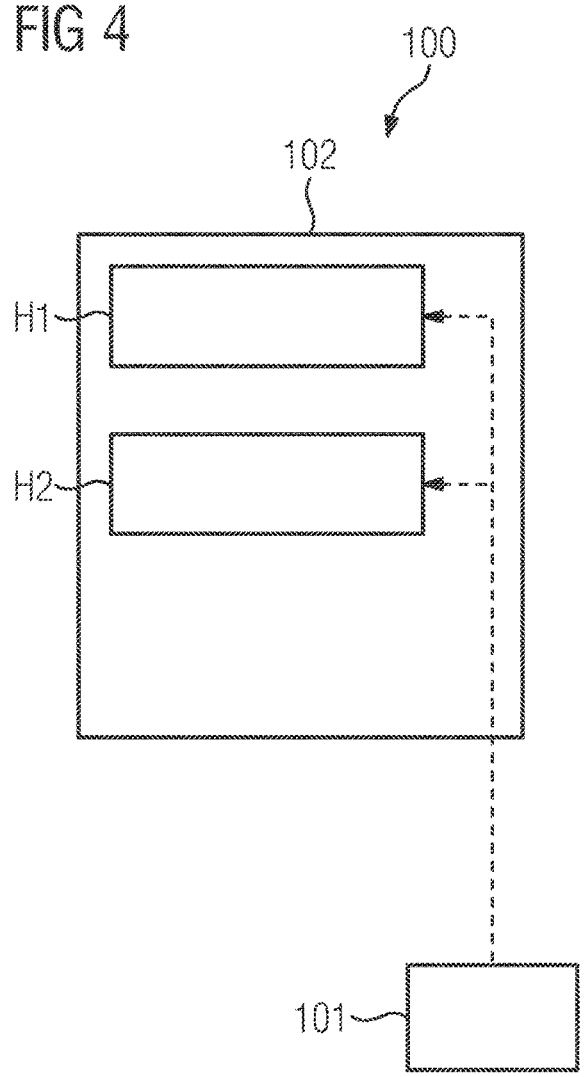

METHOD FOR RECORDING DIAGNOSTIC MEASUREMENT DATA OF A KNEE OF AN EXAMINATION OBJECT IN KNEE IMAGING BY A MAGNETIC RESONANCE DEVICE

PRIORITY STATEMENT

This application is the national phase under 35 U.S.C. § 371 of PCT International Application No. PCT/US2018/058659, which has an International filing date of Nov. 1, 2018, which designated the United States of America, and which claims priority to U.S. provisional application No. 62/738,163 filed Sep. 28, 2018, the entire contents of each of which are hereby incorporated herein by reference.

FIELD

Example embodiments generally relate to a method for recording diagnostic measurement data of a knee of an examination object in knee imaging using a magnetic resonance device, a magnetic resonance device and a computer program product.

BACKGROUND

In a magnetic resonance device, also referred to as a magnetic resonance imaging system, the body of an examination object to be examined, for example, of a patient, a healthy subject, an animal or a phantom, is usually exposed to a relatively high main magnetic field, for example, of 1.5 or 3 or 7 Tesla, with the aid of a main magnet. In addition, gradient circuits are output with the aid of a gradient coil unit. By way of a high-frequency antenna unit high-frequency pulses, for example, excitation pulses, are then emitted by the appropriate antenna equipment resulting in the nuclear spins of certain atoms resonantly excited by these high-frequency pulses being tilted around a defined flip angle opposite the magnetic field lines of the main magnetic fields. Upon relaxation of the nuclear spins, high-frequency signals, so-called magnetic resonance signals, are emitted, which are received by the appropriate high-frequency antennae and then further processed. The desired image data can be finally reconstructed from the raw data acquired in this way.

SUMMARY

Magnetic resonance imaging can be used particularly advantageously to record diagnostic image data of a knee of the examination object in knee imaging. Example embodiments are directed to providing an improved method for knee imaging using a magnetic resonance device.

The method for recording diagnostic measurement data of a knee of an examination object in knee imaging using a magnetic resonance device comprises the following method steps:
  performing an overview scan of the knee of the examination object, wherein overview measurement data is acquired in the overview scan, and
  performing various diagnostic scans of the knee of the examination object based on the acquired overview measurement data, wherein two-dimensional diagnostic measurement data is acquired in the diagnostic scans.

At least one embodiment provides that the knee imaging comprises a maximum of one user interaction.

At least one embodiment provides that the number of diagnostic scans is at least four.

At least one embodiment provides that any two diagnostic scans of the diagnostic scans differ in at least contrast or layer orientation.

At least one embodiment provides that at least one measurement layer is different in each of diagnostic scans.

At least one embodiment provides that at least two diagnostic scans have a different layer orientation.

At least one embodiment provides that based on the overview measurement data for the diagnostic scans, parameters and/or adjustments are determined individually for the examination object in an evaluation step.

At least one embodiment provides that recording parameters of the diagnostic scan and the overview scans are coordinated in such a way that the knee imaging is concluded within an imaging period of a maximum of 7 minutes.

At least one embodiment provides that the examination object only remains in the magnetic resonance device during the imaging period.

At least one embodiment provides that at least two diagnostic scans of the diagnostic scans have a contrast with fat suppression.

At least one embodiment provides that at least two diagnostic scans are accelerated by a technique combining acceleration within a measurement layer and acceleration perpendicular to a measurement layer.

At least one embodiment provides that acceleration within a measurement layer is achieved by subsampling and parallel imaging.

At least one embodiment provides that acceleration perpendicular to a measurement layer is achieved by simultaneous multislice imaging.

At least one embodiment provides that at least two diagnostic scans of the diagnostic scans are accelerated by an acceleration factor of at least 4.

At least one embodiment provides that at least two diagnostic scans have a sagittal layer orientation and a differing contrast.

At least one embodiment provides that at least two diagnostic scans have a coronal layer orientation and a differing contrast.

At least one embodiment provides that at least two diagnostic scans have a sagittal layer orientation and a differing resolution.

At least one embodiment provides that at least two diagnostic scans have a coronal layer orientation and a differing resolution.

At least one embodiment provides that at least three diagnostic scans have a contrast with fat suppression.

At least one embodiment provides that the number of diagnostic scans is a maximum of seven.

At least one embodiment provides that the number of diagnostic scans is a maximum of six.

At least one embodiment provides that the number of diagnostic scans is a maximum of five.

At least one embodiment provides that the number of diagnostic scans is a minimum of three.

At least one embodiment provides that recording parameters of the diagnostic scans and the overview scan are coordinated in such a way that knee imaging is concluded within an imaging period of 6.5 minutes maximum.

At least one embodiment provides that recording parameters of the diagnostic scans and the overview scan are coordinated in such a way that knee imaging is concluded within an imaging period of 5 minutes maximum.

At least one embodiment provides that at least one diagnostic scan of the various diagnostic scans comprises the use of a local coil unit for radiation of high frequency fields.

At least one embodiment provides that the high frequency fields radiated by the local coil unit are circularly polarized.

BRIEF DESCRIPTION OF THE DRAWINGS

Hereinafter some example embodiments are described and explained in more detail with reference to the exemplary embodiments shown in the figures.

The figures show:

FIG. 2 a sequence of a second knee imaging according to example embodiments,

FIG. 3 a magnetic resonance device for the performance of knee imagings according to example embodiments, and FIG. 4 a selection system which enables a user to select a knee imaging to be performed according to example embodiments.

DETAILED DESCRIPTION

Figure 1:
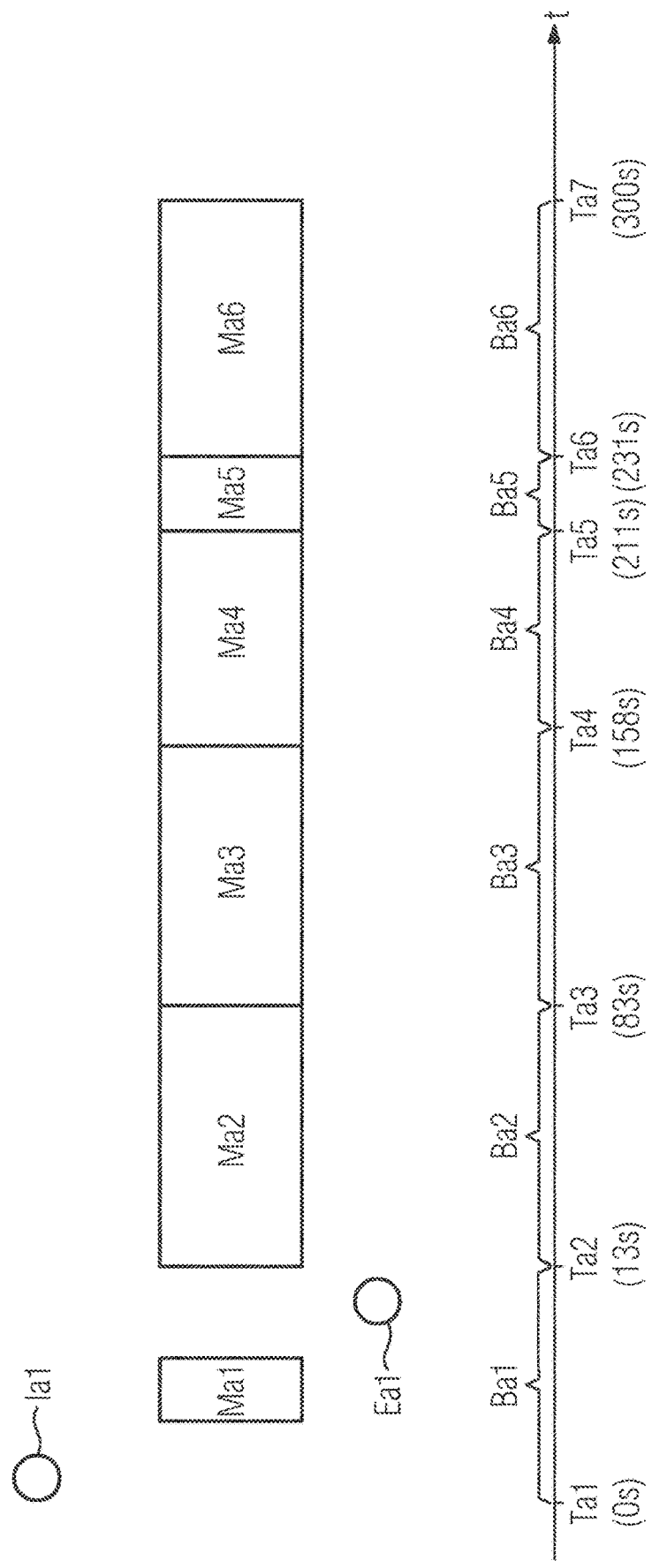
FIG. 1 a sequence of a first knee imaging according to example embodiments.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. Example embodiments, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature (s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments. Example embodiments may, however, be embodied in many alternate forms and should not be construed as limited to only the embodiments set forth herein.

Units (e.g., computing units) and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion.

In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

The proposed procedures for knee imaging(s) may have the advantage that very high quality image data of the knee of the examination object can be recorded. In such a manner, based on the acquired image data, a multiplicity of possible diseases and/or pathologies of the knee of the examination object can be detected particularly advantageously where they occur. Naturally, additional indications appearing useful to a person skilled in the art can also be examined based on the acquired image data.

Precisely a possible integrated evaluation of the acquired measurement data (so-called inline processing) can lead to a reduction in the time until the final examination results and/or examination reports are available. The integrated evaluation of the acquired measurement data for the preparation of diagnostic information can take place in full after conclusion of the acquisition of all the measurement data. Alternatively, it is also conceivable that diagnostic measurement data is already being reconstructed and/or evaluated as long as the acquisition of additional measurement data of the examination object is still going on. The integrated evaluation of the acquired measurement data can be used for the integrated evaluation of measurement data of the examination object acquired during a measuring block to determine recording parameters, such as for example, the positioning of measurement layers and/or the size of a recording area or for the acquisition of measurement data of the examination object in a subsequent measuring block. Thus, the integrated evaluation of the acquired measurement data can fulfill a valuable dual role.

Furthermore, the proposed knee imaging may have the advantage that the image data of the knee of the examination object required for a particular diagnostic question can be recorded particularly quickly. This can increase the number of knee imaging examinations per hour. At the same time, especially few movement artifacts may be present in the acquired image data. The proposed knee imaging can therefore also be used advantageously for examination objects which do not behave cooperatively. The order of the measuring blocks is prioritized, so that if an interruption would occur prematurely, the finished measuring blocks will provide highest clinical value.

The proposed knee imaging may allow high acceleration factors in two-dimensional knee imaging due to an optimal combination of simultaneous multislice imaging and parallel imaging, minimizing the loss in the signal-to-noise ratio despite high sub-sampling. The proposed optimal combination of simultaneous multislice imaging and parallel imaging provides an ideal balance between total duration of the knee imaging, slice separation, signal-to-noise ratio and resolution. Compared to an equally high acceleration factor achieved by pure parallel imaging, signal-to-noise is improved. Compared to an equally high acceleration factor achieved by Compressive Sensing, the combination of simultaneous multislice imaging and parallel imaging is robust in two-dimensional imaging.

Furthermore, the proposed knee imaging may have the advantage that it is particularly user-friendly and easy to use. It is advantageously conceivable that the proposed knee imaging may also be performed by personnel who are not specially trained. The proposed knee imaging makes a selection of measuring blocks and/or specific parameters obsolete. Above all, the proposed automation can also enable an inexperienced user to acquire high-quality image data in the course of knee imaging and/or the proposed minimization of necessary user interaction for knee imaging. A standardized procedure for the proposed knee imaging can also lead to consistent and easily comparable examination results.

Furthermore, the proposed knee imaging may have the advantage that it constitutes a standardized examination of the knee. This enables comparable results among different institutions, but also within hospitals with varying procedures and preconditions organizing into larger institutions.

The magnetic resonance device according to some example embodiments comprises a measurement data acquisition unit and a computing unit, wherein the magnetic resonance device is designed to perform a method according to some example embodiments.

Thus, the computing unit in particular is designed to execute computer-readable instructions to perform the method according to some example embodiments. In particular, the magnetic resonance device comprises a storage unit, wherein computer-readable information is stored on the storage unit, wherein the computing unit is designed to load the computer-readable information from the storage unit and to execute the computer-readable information to perform a method according to some example embodiments.

The computing unit can be designed to transmit control signals to the magnetic resonance device, in particular to the measurement data acquisition unit of the magnetic resonance device and/or to receive and/or process control signals to perform a method according to some example embodiments. The computing unit can be integrated in the magnetic resonance device. The computing unit can also be installed separately from the magnetic resonance device. The computing unit can be connected to the magnetic resonance device.

To provide support for the performance of the method according to some example embodiments, the computing unit can be designed in several sub-computing units which support the performance of various tasks for knee imaging or perform these various tasks.

Thus, a first sub-computing unit of the computing unit can be designed as a service computer, also referred to as a host computer. The service computer is, in particular, designed to prepare and process user interactions. Furthermore, the service computer can be designed to control the magnetic resonance device for the performance of knee imagings. Furthermore, the service computer can already further process reconstructed image data in the overview scans and diagnostic scans. The further processing of image data by the host computer may, for example, comprise an evaluation of the image data, for example, a determination of a spatial extent of a particular tissue. Further processing of the image data by the host computer may alternatively or in addition, also comprise a calculation of recording parameters for the following measurements on the basis of the image data.

A second sub-computing unit of the computing unit can be designed as a reconstruction computer. The reconstruction computer is, in particular, designed to reconstruct image data from the overview measurement data and diagnostic measurement data. The reconstruction computer can exchange data with the service computer for this purpose. The reconstruction computer can, in particular, be integrated into the magnetic resonance device. The reconstruction computer can reconstruct already acquired measurement data parallel to the acquisition of additional measurement data. In such a manner, reconstructed image data can already be available for further processing by the service computer during the performance of knee imaging in the sense of "inline-processing". The reconstruction computer can also take over part of the further processing of reconstructed image data, in particular for the calculation of recording parameters for the following measurements. In such a manner, the reconstruction computer can, for example, be designed to recognize landmarks on image data to automatically determine a recording area.

The components of the computing unit of the magnetic resonance device according to some example embodiments can predominantly be designed in the form of software components. In principle, however, some these components can also be realized, especially where particularly rapid calculations are involved, in the form of software-supported hardware components, for example, FPGAs or the like. Likewise, the requisite interfaces can, for example, be designed as software interfaces if it is only a matter of the transfer of data from other software components. However, they can also be designed as hardware interfaces which are controlled by appropriate software. Naturally, it is also conceivable that several of the aforementioned components are combined in the form of an individual software component or software-supported hardware components.

Thus, the magnetic resonance device, in particular the measurement data acquisition unit and the computing unit, is designed to execute a method for recording diagnostic measurement data of a knee of an examination object in knee imaging using the following methods:

performing an overview scan of the knee of the examination object, wherein overview measurement data is acquired in the overview scan, and performing various diagnostic scans of the knee of the examination object based on the acquired overview measurement data, wherein two-dimensional diagnostic measurement data is acquired in the various diagnostic scans.

The computer program product according to some example embodiments can be loaded directly into a storage unit of a programmable computing unit of a magnetic resonance device and has program code to perform a method according to the some example embodiments if the computer program product is executed in the computing unit of the magnetic resonance device. The computer program product may be a computer program or include a computer program. As a result, the execution of the method according to some example embodiments can be quick, identically reproducible and robust. The computer program product is configured such that it can perform the method steps according to some example embodiments using the computing unit. The computing unit must satisfy each of the conditions such as, for example, a corresponding main memory, a corresponding graphic card or a corresponding logic unit so that the respective method steps can be efficiently performed. The computer program product is, for example, stored on a computer-readable medium or on a network or server from where it can be loaded into the processor of a local computing unit which is directly linked to the magnetic resonance device or can be designed as part of the magnetic resonance device. Furthermore, control information from the computer program product can be stored on a computer-readable medium. The control information of the computer-readable medium can be designed such that it performs a method according to some example embodiments when the data medium is used in a computing unit of the magnetic resonance device. Thus, the computer program product can also represent the computer-readable medium. If this control information (software) is read from the computer-readable medium and stored in a control and/or computing unit of the magnetic resonance device, all the embodiments according to some example embodiments of the aforementioned method can be performed. Thus, some example embodiments can also originate from the computer-readable medium in question and/or the electronically-readable data medium.

The advantages of the magnetic resonance device according to some example embodiments and the computer program product according to some example embodiments essentially correspond to the advantages of the method according to some example embodiments previously described in detail. Features, advantages or alternative embodiments mentioned here are likewise also to be transferred to the other claimed objects and vice versa. In other words, the claims in question can also be developed with the features which are described or claimed in connection with a method. The corresponding functional features of the method are embodied by corresponding representational modules, in particular by hardware modules.

General Preliminary Remarks Regarding the Description of Knee Imagings

In FIGS. 1-2, two possible knee imaging sequences are shown. Thus, in FIG. 1 a sequence of a knee imaging is shown. FIG. 2 shows a sequence of a second knee imaging. In the respective description of the figures, first the concrete sequence or workflow for the respective knee imaging is described for each knee imaging. Then various acceleration techniques and automation techniques are explained for the respective knee imaging and underlying principles. The description of the knee imagings in FIGS. 1-2 is based on the use of a magnetic resonance device with a main magnetic field with a strength of 3 Tesla. It is further based on the use of a local radiofrequency unit configured for both transmission and reception of radiofrequency fields. The local radiofrequency unit preferably comprises 15 channels for reception. The local radiofrequency unit preferably comprises one channel for transmission. In particular, the local radiofrequency unit comprises less than two channels for transmission. When using a different main magnetic field strength and/or a different receive unit, the knee imagings of the knee imagings shown in FIGS. 1-2, in particular the precise periods and/or recording parameters, may differ. This is described separately.

The knee imagings presented in FIGS. 1-2 in particular represent a measuring session in each case in which the examination object is examined by the magnetic resonance device. In this manner, the examination object remains positioned in the magnetic resonance device throughout the entire sequence of a presented knee imaging. In particular, the positioning of the patient bed and/or the positioning of the knee of the patient in the magnetic resonance device does not change or preferably only after completion of the overview scan and before the start of the diagnostic scans of respective knee imaging. The knee imagings presented in FIGS. 1-2 are typically characterized in the fact, that a knee to be imaged remains positioned within a receive unit and or at least partially covered and/or surrounded by such receive unit throughout the imaging period required for the knee imagings presented in FIGS. 1-2. The knee imagings presented in FIGS. 1-2 are typically characterized in providing comprehensive measurement data of the examination object such that further measurement data is obsolete in regard to diagnosis. The knee imagings presented in FIGS. 1-2 are typically characterized in the examination having a maximum of one knee imaging per day.

In each case, the knee imaging described is divided into several, in particular immediately, consecutive measuring blocks Ba, Bb. In each measuring block Ba, Bb in particular, in each case a recording Ma, Mb of measurement data takes place. Besides the recording Ma, Mb of the measurement data, a measuring block Ba, Bb may comprise a user interaction regarding the preparation of the recording Ma, Mb.

Each measurement data acquired in each recording Ma, Mb is preferably self-contained. Each measurement data acquired in each recording Ma, Mb can be reconstructed to image data, preferably by an algorithm applied to each measurement data, preferably without additional measurement data. One measuring block preferably comprises exactly one recording Ma, Mb of measurement data. Each recording Ma, Mb of measurement data is preferably performed by the execution of one magnetic resonance sequence. Thus, during execution of one magnetic resonance sequence, measurement data is acquired, which measurement data typically is sufficient for the reconstruction of image data of a desired field of view.

The type of magnetic resonance sequence and respective recording parameters typically define a contrast of the image data to be reconstructed. Typically, the signal intensity depends on the underlying tissue and the contrast of the recording, so that different tissues are depicted differently with different contrasts, whereby a tissue particularly can be determined particularly precisely and therefore a pathology particularly precisely detected. With the reconstruction of the diagnostic measurement data to diagnostic image data, the diagnostic image data displays the contrast of the diagnostic measurement data. The aforementioned contrasts in particular enable a comprehensive diagnosis of different clinical pictures, in particular of the diseases in the section "General information about the first knee imaging".

Two-dimensional imaging is characterized by the acquisition of measurement data corresponding to parallel measurement layers. The acquisition of measurement data corresponding to one measurement layer can typically be performed independently of the acquisition of measurement data corresponding to another measurement layer. However, usually the acquisition of measurement data corresponding to various measurement layers takes place at least partially simultaneously to reduce the overall measurement time. Reconstruction of the measurement data results in image data structured in parallel measurement layers.

The recording may be an overview scan in which overview measurement data is acquired. The overview measurement data is mainly, possibly exclusively, provided for the determination of recording parameters of a recording Ma, Mb which takes place in one of the following measuring blocks Ba, Bb. The overview measurement data is primarily used to determine recording parameters for a measurement in a subsequent measuring block Ba, Bb. From the overview measurement data, furthermore, image data, in particular overview image data, can also be reconstructed and are stored in a database. The determination of recording parameters for a subsequent recording usually takes place with the aid of the overview image data; thus, for example, using the overview image data the layer positioning, the layer orientation and/or the layer spacing are determined. However, extraction of recording parameters for a subsequent recording can also take place based on overview measurement data.

The overview image data reconstructed from the overview measurement data is usually not of key interest for a diagnosis. The overview measurement data can also be stored together with the overview image data. As a rule, overview measurement data is only shown to a doctor for the diagnosis insofar as they show him the point at which the actual diagnostic image data was recorded. Thus, in the overview measurement data, for example, the position or positions which indicate the position of the actual diagnostic image data in the body can be marked. In some cases, it is also conceivable that the overview measurement data is not stored in a database and after being used to determine recording parameters are discarded again.

Alternatively, or in addition, the recording Ma, Mb can be a diagnostic scan in which diagnostic measurement data is acquired. From the diagnostic measurement data, in particular diagnostic image data can be generated which can be displayed for a diagnosing doctor on a display unit. In particular, therefore, the diagnostic measurement data present data which is reconstructed as image data which in a later diagnostic diagnosis are shown to a doctor to make the actual diagnosis based on the image data. From the diagnostic measurement data, alternatively or in addition, physiological parameters of the knee of the examination object can be calculated which can be made available to the diagnosing doctor. In a recording of diagnostic measurement data, no diagnosis in the proper sense is activated. Only diagnostic measurement data is recorded and, if necessary, reconstructed as diagnostic image data, which in its entirety enables a trained radiologist to recognize an adequate range of neurological diseases. If necessary, a diagnosis can be made on the basis of the diagnostic measurement data. In addition, the diagnostic measurement data can also be used to determine recording parameters of a recording Ma, Mb which takes place in one of the following measuring blocks Ba, Bb. In the first knee imaging and in the second knee imaging, the determination of recording parameters takes place from a recording Ma, Mb preferably based on the overview measurement data.

In addition, the measuring blocks Ba, Bb may also comprise an evaluation step Ea, Eb in which the measurement data acquired during the respective measuring block Ba, Bb is evaluated. The evaluation of the measurement data takes place in the evaluation step Ea, Eb in particular, immediately after the acquisition of the measurement data. The evaluation of the measurement data in the evaluation step Ea, Eb typically provides information to determine recording parameters for a recording Ma, Mb which takes place in one of the following measuring blocks Ba, Bb. Before determining the recording parameters, typically a reconstruction of image data is already performed from the overview measurement data, wherein the recording parameters can then be determined on the basis of image data. Alternatively, the measurement data in the evaluation step Ea, Eb can also only be reconstructed to such an extent that only the determination of the recording parameters from a recording which takes place in one of the following measuring blocks is possible on the basis of the reconstructed image data.

The automatic determination of the recording parameters can take place by an, in particular algorithmic, evaluation of overview image data which has been reconstructed from the acquired overview measurement data. If an evaluation of overview measurement data to determine recording parameters for a measurement in a subsequent measuring block Ba, Bb takes place in the evaluation step Ea, Eb, the determination of the recording parameters and consequently the preparation of the diagnostic scans Ma2-Ma6 can take place particularly quickly. Overview image data reconstructed from the overview measurement data can be reconstructed in a fraction of the time of the associated measuring block and shown to a user on a user interface, for example, to validate the determination of the recording parameters. Recording parameters can thus be automatically proposed to a user and a user can decide to either accept or modify the proposal. Recording parameters based on overview measurement data and/or overview image data can also be provided for future measuring blocks and/or the preparation thereof without interaction of a user and/or validation by a user. In such case, an interaction by a user and/or a delay, in particular a delay linked to the visualization and/or interaction by the user, become obsolete.

In addition, the measuring blocks Ba, Bb may also comprise user interaction Ia, Ib. With user interaction Ia, Ib, in particular, preparation of knee imaging takes place, wherein the examination object, in particular of the patient, is positioned. User interaction Ia, Ib may comprise the input of a user command using an appropriate input unit. In the user interaction Ia, Ib, recording parameters for the recording Ma, Mb can be entered in the respective measuring block Ba, Bb and/or for a subsequent recording Ma, Mb. In the user action Ia, Ib, recording parameters can also be changed.

The depiction of the knee imagings in the FIGS. 1-2 is always along a horizontal timeline t which is arranged at the bottom of the figures. On the timeline, in each case several points in time Ta, Tb are plotted several times. The points in time are starting and ending times of measuring blocks Ba, Bb; the temporal period and arrangement of which is plotted immediately above the horizontal timeline. For each measuring block Ba, Bb, the respective recording Ma, Mb is plotted as a box. Indications for the temporal period of the recordings Ma, Mb and the positioning of the recordings Ma, Mb within the respective measuring block Ba, Bb can be read out from the FIGS. 1-2. Of course, temporal periods of the recordings Ma, Mb different from the depiction and different positioning of the recordings Ma, Mb inside the respective measuring block Ba, Bb are also conceivable, however.

Possible user interactions Ia, Ib taking place in the measuring block Ba, Bb are plotted as a circle over the recordings Ma, Mb. Possible evaluation steps Ea, Eb taking place in the measuring block Ba, Bb are plotted as a circle under the recordings Ma, Mb. The user interactions Ia, Ib and evaluation steps Ea, Eb are plotted with an exemplary period at their respective typical temporal position inside the knee imaging. Reference points for the temporal positioning of the user interactions Ia, Ib and evaluation steps Ea, Eb inside the respective measuring block Ba, Bb can be read from the FIGS. 1-2. Naturally, however, different temporal positioning and temporal periods of the user interactions Ia, Ib and evaluation steps Ea, Eb inside the respective measuring block Ba, Bb are also conceivable from the depiction.

FIG. 1—First Knee Imaging

General Information about the First Knee Imaging

The first knee imaging, the sequence of which is shown in FIG. 1, in particular provides diagnostic measurement data which can serve as the basis for an assessment of the anatomy and/or pathology of the knee of the examination object. Preferably, the first knee imaging can take place so thoroughly that a multiplicity of possible diseases and/or pathologies of the knee of the examination object can be detected when they occur. Examples of such diseases are damages or pathological changes to cartilage, menisci, extensor mechanism, cruciate ligaments, patellofemoral ligaments, bone marrow and joints. In particular, it is an objective of the first knee imaging to record the diagnostic measurement data required for the assessment of the anatomy and/or pathology of the knee of the examination object in a short first imaging period, compared with traditional, comparable examinations of the knee by a magnetic resonance device, while perpetuating image characteristics of two-dimensional image data. The diagnostic measurement data is preferably recorded in the short first imaging period such that the anatomy and/or pathology of the knee can be ascertained and provided in sufficient quality despite the comparatively short first imaging period.

Image characteristics can comprise image contrast, i.e. signal differences in image data between different tissues. Image characteristics can comprise image resolution, especially in particular planes or relative image resolution of different spatial directions. Image characteristics can comprise the sharpness of details visible in image data. Image characteristics can comprise a signal-to-noise ratio of the image data. Image characteristics can comprise the time required for the acquisition of measurement data. Image characteristics can comprise the likelihood of motion during acquisition of measurement data affecting the quality of image data.

Two-dimensional imaging has been the historic approach used by radiologists over several years, resulting that respective image characteristics of two-dimensional image data have become gold standard. Although three-dimensional imaging of the knee has become more popular in recent years, related disadvantages compared to two-dimensional imaging of the knee are a prolonged time required for the acquisition of measurement data within one measuring block, resulting in a higher likelihood of motion during the acquisition of measurement data. In three-dimensional imaging, the total time required for imaging of different contrasts and orientations may be reduced compared to two-dimensional imaging, but the duration of single measuring blocks may be prolonged. This can cause a loss in image quality and/or require a repetition of the acquisition of measurement data. Additionally, the timing of magnetic resonance sequences used for three-dimensional imaging differs intrinsically from corresponding magnetic resonance sequences used for two-dimensional imaging. Thus, contrast and/or sharpness of image data differ. Image data obtained by three-dimensional imaging often features higher resolution and/or isotropic resolution, resulting in differing signal-to-noise ratio.

The first knee imaging has a first imaging period which elapses from a starting time Ta1 of the first knee imaging until a sixth point in time Ta6, in which the recording of measurement data in the first knee imaging is finished. The first imaging period is preferably 10 minutes maximum, advantageously 8 minutes maximum and particularly advantageously 6 minutes maximum, most advantageously 5 minutes maximum.

The first imaging period is, in particular, dependent on the choice of the receive unit which is used to receive magnetic resonance signals. The higher the number of individual receive channels of the receive unit employed, the shorter the first imaging period can be. A variability of the first imaging period is given, in particular analogous to the specified areas, or to the variability for the period of the measuring blocks comprised by the first imaging. The first imaging period is, in particular, designed as a maximum imaging period which ideally is not exceeded for the performance of the first knee imaging. A period of user interactions or parameter settings can be included in the first imaging period for the acquisition of measurement data. In certain cases, it is also conceivable that a period of patient positioning is included in the first imaging period. Alternatively, the first imaging period may also be characterized by the fact that more than 60 percent, in particular more than 75 percent, most advantageously more than 90 percent of a series of various examinations which are performed in accordance with the diagram in FIG. 1 for the first knee imaging in the clinical routine include the first imaging period.

FIG. 1 shows the particularly advantageous case in which the first imaging period of the first knee imaging lasts 5 minutes. After completion of the recording of the measurement data in the first knee imaging, further time may elapse in which subsequent processing and/or evaluation of the measurement data takes place. However, the examination object must only remain in the magnetic resonance device during the first imaging period. After the first imaging period, a subsequent examination object can be positioned in the magnetic resonance device as a result of which better utilization of the device can be achieved.

Description of a Possible Concrete Sequence of the First Knee Imaging

Preparation of the First Knee Imaging

Firstly, in particular, it is established that knee imaging of the examination object should be performed. A maximum imaging period of the first knee imaging can be determined, wherein the maximum imaging period in particular may not be exceeded by first imaging period. The establishment of the maximum imaging period can take place directly, for example, by a user entering the maximum imaging period for the entire examination sequence of the first knee imaging directly into an input screen. The establishment of the maximum imaging period can also take place indirectly, for example, by the user selecting a variant linked to the maximum imaging period, in particular the first knee imaging from a multiplicity of different established procedures for knee imaging, for example, by an interaction on a user interface. Once a maximum imaging period is established, a user obtains planning security for the period and/or feasibility of the first knee imaging.

Before the starting time Ta1 of the first knee imaging, patient-specific features can be automatically or manually recorded. Imaging parameters for the first knee imaging can then be adjusted based on the patient-specific features. The subsequent temporal sequence of the individual measuring blocks can be varied on the basis of the specific input of the patient-specific feature and as a function thereof.

A possible patient-specific feature is a language which is to be used for commands to the examination object. Furthermore, for example, the height of the examination object can be recorded. A typical position of the knee of the examination object can be estimated based on the height, enabling the knee of the examination object to be positioned in approximately the isocenter of the magnetic resonance device or in the field of view of the magnetic resonance device before the recording of the first measurement data.

After entering the patient-specific features and appropriately positioning the patient support device on which the examination object is supported in the magnetic resonance device, the first knee imaging can be started. The first knee imaging starts, in particular, after activation of a start button by a user.

In another embodiment, the first knee imaging can start automatically after the examination object has been positioned on a patient positioning device and/or a local coil unit has been arranged to acquire measurement data from said knee. The magnetic resonance device, in particular a computing unit, may import data about the examination object required to start the first knee imaging automatically from a storage device. The magnetic resonance device, in particular a computing unit, can be configured to determine recording parameters, which are, for example, used for a following measuring block and/or the overview scan.

Measuring block Ba1

The first knee imaging displayed starts at a first point in time Ta1 or starting time Ta1 with a first measuring block Ba1. In the first measuring block Ba1, a first user interaction Ia1 takes place, an overview scan Ma1 during which first overview measurement data is acquired, and a first evaluation step Ea1.

In the case shown, the first measuring block Ba1 has a first period of 13 seconds. The first period is preferably between 5 seconds and 25 seconds, in particular between 8 and 18 seconds, in particular between 10 seconds and 16 seconds. Between 3 and 20 seconds, in particular between 9 and 15 seconds, in particular 12 seconds of the first period are in the pure measurement period of the first overview scan Ma1 for the acquisition of the first overview measurement data. In particular, only that time which is required for the acquisition of the magnetic resonance signals which constitute the measurement data, in other words, for the playing out of the actual magnetic resonance sequence for this section of the first measuring block Ba1, is designated as a pure measurement period. The pure measurement period may therefore only comprise a period for filling the k-space with the measurement data.

Another period of the first measuring block Ba1 is partly attributable to the first user interaction Ia1 and to the first evaluation step Ea1. The first user interaction Ia1 may, for example, comprise the preparation of the acquisition of the first overview measurement data. In particular, the first user interaction Ia1 may comprise the output of voice commands to the examination object. The first user interaction Ia1 may, for example, comprise the activation of a start button by a user at the beginning of the overview scan Ma1. If the first user interaction Ia1 comprises the preparation of the acquisition of the first overview measurement data, the first knee imaging can also start automatically after completion of the preparations. Furthermore, adjustment measurements which, for example, comprise the adjustment of a transmitter and receiver voltage of the magnetic resonance device, can be made inside the first measuring block Ba1 before starting the first overview scan Ma1 in preparation for the acquisition of the measurement data.

The first overview scan Ma1 is performed from a knee region of the examination object. The first overview scan Ma1 is therefore, in particular, a measurement which is used to establish the recording parameters for subsequent measuring blocks. After performance of the recording scheme shown in FIG. 1, it does not usually play a significant role in the further diagnosis of the diagnostic measurement data. Thus, the first overview scan Ma1 can also generally speaking be described as a localizer measurement or scout measurement. The overview measurement data recorded in the first overview scan Ma1 comprises, in particular, several low-resolution measurement layers, advantageously in various layer orientations. Preferably, the first overview scan Ma1 acquires three-dimensional image data of the knee, typically comprising a rectangular cuboid field of view. In particular, the layer orientations in which the first overview scan Ma1 was produced differ from the layer orientations in which the subsequent measurement data is recorded in that the layer orientations for the first overview scan Ma1 are tilted in relation to the subsequent layer orientations.

The first overview scan Ma1 is preferably designed in such a way that based on the first overview measurement data, the parameters and/or adjustments necessary for the subsequent recordings can be determined individually for the examination object in the first evaluation step Ea1. This preferably takes place automatically and is therefore robust, replicable and independent of the user, in particular, objective. The first overview scan Ma1 is typically performed with a gradient echo magnetic resonance sequence. The first overview scan Ma1 is designed as a three-dimensional image of the knee. To acquire the first overview measurement data Ma1, a gradient echo magnetic resonance sequence is preferably used which, for example, is implemented as a Fast Low-Angle Shot (FLASH) magnetic resonance sequence.

The recording area which is recorded by the first overview scan Ma1 is a volume which is phase-coded in a second direction and in a third direction and frequency-coded in a first direction. The second direction is perpendicular to the first direction and the third direction is perpendicular to the first and to the second direction. One layer or slice as conventionally defined in two-dimensional imaging is typically determined by the first direction and the second direction.

Measurement data of one layer or slice determined by the first direction and the second direction is analogously acquired as in conventional two-dimensional imaging. A layer and/or slice and/or direction as used in the first overview scan Ma1 is typically determined relatively to a coordinate system determined by the magnetic resonance device or the receive unit. A layer and/or slice and/or direction as used in the first overview scan Ma1 is typically determined independently of the examination object and/or its position. Due to the inherent position and orientation of the examination object within the magnetic resonance device, the following definitions of orientations and directions preferably refer to the a coordinate system determined by the magnetic resonance device and are rough descriptions of the orientations and directions within the examination object for the first overview scan Ma1. The third direction is preferably perpendicular to the transverse plane. The third direction and the second direction preferably define a sagittal layer orientation. One layer or slice as conventionally defined in two-dimensional imaging typically exhibits a first layer orientation. The first layer orientation is preferably a transverse layer orientation. The second direction of the first overview scan Ma1 is preferably aligned with the anterior-posterior axis of the knee of the examination object.

The pixel resolution is preferably isotropic. As a result, the orientation and/or tilting of the measurement layers for at least one diagnostic scan can typically be determined with particular precision. As a pixel resolution in the first direction and/or in the second direction and/or in the third direction, a range of between 1.0 mm and 3.0 mm, preferably a range of between 1.5 mm and 2.5 mm and particularly preferably a range of between 1.8 mm and 2.2 mm has proved appropriate. In particular, in the third direction the aforementioned pixel resolution can be produced by interpolation, wherein the pixel resolution in the third direction which would result from the measured points in the k-space, for example, is lower by at least 10%, advantageously by at least 20% and most advantageously by 32%. By zero filling of the k-space, interpolated voxels can be produced which are of the same size in the first direction and in the second direction and in the third direction. In this way, the first period can be reduced without any visible decline in quality.

In the third direction measurement data acquisition, also referred to as phase oversampling, preferably takes place of an additional range beyond the spatial expansion of the area under examination. The additional range is preferably between 0% and 40%, in particular preferably between 5% and 20%, preferably 10% of the spatial expansion of the area under examination in the first direction. This can reduce and/or eliminate fold artifacts and/or increase the signal-to-noise ratio of the resulting image data. Typically, the third direction is perpendicular to the transversal plane of the examination object and aligned with a symmetric axis of the receive unit. Thus, geometric properties of the receive unit limit the area of the examination object contributing to signal generation and thus limit folding artifacts. Residual folding artifacts can be eliminated by the relatively low range for phase oversampling in the third direction.

The recording area of the first overview scan Ma1 is preferably a volume which has a spatial expansion in the range of between 300 mm and 500 mm, preferably between 420 mm and 480 mm and particularly preferably of 450 mm in the first direction and/or in the second direction, i.e. in the transversal plane. The spatial expansion in the first direction and in the second direction preferably matches. The spatial expansion of the recording area in the third direction is in the range of between 120 mm and 260 mm, preferably between 160 mm and 2200 mm and particularly preferably between 180 mm and 200 mm. The third direction preferably is aligned with the long axis of the magnetic resonance device. The third direction preferably connects a proximal and a distal position of the knee and/or leg of the examination object.

The high frequency pulse which is used to excite nuclear spins in the context of the gradient magnetic resonance sequence is, for example, between 4° and 20°, preferably between 8° and 16° and particularly preferably 12°. The number of voxels per measurement layer in the second direction is, for example, between 128 and 384, preferably between 192 and 156 and particularly preferably 224. The number of voxels in the first direction preferably corresponds to the number of voxels in the second direction.

The repetition time of the first overview scan Ma1 is preferably selected such that the repetition time preferably does not exceed the minimum repetition time by 20% maximum, preferably by 10% maximum, in particular. A period of less than 10 ms, preferably of less than 6 ms and particularly preferably of less than 4 ms is preferably selected as a repetition time. Preferably, the first overview scan Ma1 takes place with an echo time which preferably does not exceed the minimum echo time by 20% maximum, preferably by 10% maximum, in particular. The minimum echo time typically corresponds to the period between the high frequency pulse of excitation and the temporal focus of the echo, which period is at least required on account of the magnetic resonance device used and/the high-frequency pulses used for excitation and/or for refocusing. A period of less than 5 ms, preferably of less than 3 ms and particularly preferably of less than 2 ms is preferably selected as the echo time. The bandwidth of the frequency coding in the first overview scan Ma1 is typically in the range of between 450 Hertz per pixel and 650 Hertz per pixel, preferably between 500 Hertz per pixel and 600 Hertz per pixel, and particularly preferably 540 Hertz per pixel.

To acquire the first overview measurement data, acceleration technology is preferably used. In particular, the use of parallel imaging is conceivable, which is preferably used with an acceleration factor of between 2 and 4, in particular preferably with an acceleration factor of 3. To acquire the first overview measurement data, a partial Fourier technique is used to accelerate acquisition, which partial Fourier technique provides that the k-space is only partially sampled, typically 6/8. In particular, the use of Compressed Sensing acceleration technology is conceivable.

The aforementioned parameters concerning the magnetic resonance sequence for the first overview scan Ma1 are advantageously selected such that the first overview measurement data can be recorded in full in less than 30 seconds, in particular in less than 20 seconds, advantageously in less than 15 seconds with the magnetic resonance sequence used. Reconstructed image data can be reconstructed and provided from the first overview measurement data immediately after completion of the first overview scan Ma1.

Furthermore, the first evaluation step Ea1 can partly account for the remaining period of the first measuring block Ba1. One possible embodiment of the first measuring block Ba1, in particular of the first evaluation step Ea1, is described in Zhan, Y., et al. "Robust automatic knee MR slice positioning through redundant and hierarchical anatomy detection." IEEE Trans. Med. Imaging 30.12 (2011): 2087-2100. The publication suggests an automatic slice positioning framework based on a first three-dimensional overview scan Ma1 and based on redundant and hierarchical learning. The first evaluation step Ea1 may comprise an evaluation or subsequent processing of the first overview measurement data acquired during the first overview scan Ma1. Typically, the first overview measurement data is partly reconstructed to form overview image data. On the basis of the first overview measurement data acquired in the first overview scan Ma1, a position and/or orientation of the knee of the examination object can be identified, in particular on the basis of landmarks. The identification of the position and/or orientation of the knee preferably takes place automatically in the first evaluation step Ea1. Alternatively, the identification of the position and/or orientation of the knee can take place manually or semi-automatically. On the basis of the position of the knee identified, the patient positioning device of the magnetic resonance device is preferably repositioned such that the knee of the examination object is positioned in the isocenter of the magnetic resonance device or in the transversal plane comprising the isocenter of the magnetic resonance device. Thus, the following recordings Ma2, Ma3, Ma4, Ma5, Ma6 can be performed in the following measuring blocks Ba2, Ba3, Ba4, Ba5, Ba6 of the knee of the examination object positioned in the isocenter.

Overall, the knee is not yet specifically positioned in the isocenter (or only by chance or in the vicinity of the isocenter) for the recording of the first overview measurement data in the first measuring block Ba1, while on the basis of the first overview measurement data a repositioning of the patient can take place for the following measuring blocks Ba2, Ba3, Ba4, Ba5, Ba6 so that when recording the additional measurement data of the subsequent measuring blocks Ba2, Ba3, Ba4, Ba5, Ba6, the knee is more precisely in or closer to the isocenter than during the first measuring block Ba1.

In the first evaluation step Ea1, positioning data can be extracted from the first overview measurement data. The positioning data comprises, in particular, the spatial position of the examination object relative to the magnetic resonance device and/or a plane of symmetry in the knee of the examination object and/or the identified position and/or orientation of the knee and/or information for the repositioning of the patient positioning device. Based on the positioning data, in the context of the first evaluation steps Ea1 and/or in the context of a subsequent measuring block Ba2, Ba3, Ba4, Ba5, Ba6, measurement layers or their positioning and/or their orientation and/or a recording area and/or if applicable, phase oversampling can be determined for at least one of the following recordings Ma2, Ma3, Ma4, Ma5, Ma6. The positioning data can be provided for the subsequent measuring blocks Ba2, Ba3, Ba4, Ba5, Ba6.

In the context of the first evaluation steps Ea1 and/or in the context of a subsequent measuring block Ba2, Ba3, Ba4, Ba5, Ba6, based on the positioning data of the recording area at least one of the subsequent recordings Ma2, Ma3, Ma4, Ma5, Ma6 can preferably be defined such that the center of the knee of the examination object is positioned in the central transversal plane of the recording area and/or an axis of symmetry of the knee of the examination object matches an axis of symmetry of the recording area. The measurement layers can also be positioned such that the recording area is covered uniformly. The following recordings Ma2, Ma3, Ma4, Ma5, Ma6 can each cover different recording areas. The following measuring blocks Ba2, Ba3, Ba4, Ba5, Ba6 can typically be performed chronologically after completion of the first measuring block Ba1 in chronologically arbitrary sequence.

In the context of the first evaluation step Ea1, the type of joint, of which overview measurement data was acquired during the overview scan Ma1, may be determined. In the context of the first evaluation step Ea1, the overview measurement data may be analyzed whether data of a knee was acquired during the overview scan Ma1. This analysis may be based on a machine learning algorithm. This analysis may be based on landmark detection. Dependent on the type of joint, a measurement layer and/or a layer orientation may be determined. Dependent on the type of joint, a subsequent diagnostic scan and/or a subsequent measuring block may be selected automatically and/or suggested to a user.

The first measuring block Ba1, in particular the first overview scan Ma1 can preferably be used with a magnetic resonance device which has a main magnetic field of 1.5 Tesla. If the first overview scan Ma1 is performed with a magnetic resonance device which has a main magnetic field of 1.5 Tesla, in particular the repetition time and the echo time may vary. The repetition time at 1.5 Tesla is preferably 4.3 ms and the echo time is preferably 2.4 ms. Additionally, a magnetic resonance device which has a main magnetic field of 1.5 Tesla requires a different receive unit. The phase oversampling in the third direction is preferably increased to 20%. This can reduce and/or eliminate fold artifacts and/or increase the signal-to-noise ratio of the resulting image data.

Measuring Block Ba2

Following the first measuring block Ba1, at a second point in time Ta2, a second measuring block Ba2 starts during the first knee imaging. In the second measuring block Ba2, a first diagnostic scan Ma2 takes place during which first diagnostic measurement data is acquired.

The second point in time Ta2 in the case shown is 13 s after the starting time Ta1 of the first knee imaging. The second measuring block Ba2 in the case shown has a second period of 70 s. The second period is preferably between 40 seconds and 100 seconds, in particular between 50 and 90 seconds, in particular between 65 seconds and 75 seconds. The second period is preferably almost completely in the pure measurement period of the first diagnostic scan Ma2.

Furthermore, within the second measuring block Ba2 before the start of the first diagnostic scan Ma2 in preparation for the acquisition of measurement data, adjustment measurements can be performed which, for example, comprise the adjustment of a transmitter and receiver voltage of the magnetic resonance device. Such adjustment measurements are, in particular, performed for recordings, which recordings concern a recording area and/or a layer orientation, which recording area and/or which layer orientation differs from the previous recording. Such an adjustment measurement is typically attributed to a recording and a measuring block Ma, Mb comprises the recording and the adjustment measurement attributed to the recording.

In addition to the first diagnostic scan Ma2, the second measuring block Ba2 may comprise an adjustment measurement which typically lasts 15 seconds maximum, in particular 8 seconds maximum, in particular 5 seconds maximum, in particular 2 seconds maximum. The second period is typically extended by the duration of the adjustment measurement if an adjustment measurement is needed. A remaining period of the second measuring block Ba2 may be partly included in the preparation of the acquisition of the first diagnostic measurement data. For example, the recording area and/or the location of the measurement layers and/or the layer orientation for the first diagnostic scan Ma2 can be determined on the basis of the positioning data determined in evaluation step Ea1. The remaining period of the second measuring block Ba2 can furthermore be partly included in an evaluation or subsequent processing of the first diagnostic measurement data.

The first diagnostic scan Ma2 may generate PD-weighted image data of the knee. To acquire the first diagnostic measurement data Ma2, a spin echo magnetic resonance sequence is preferably used which, for example, is implemented as a Turbo-spin-Echo (TSE) magnetic resonance sequence. The acquisition of the recording area for the first diagnostic scan Ma2 preferably takes place two-dimensionally, wherein various measurement layers in parallel to each other are recorded. A range of between 0.2 mm and 0.8 mm, and particularly preferably 0.4 mm, has proved suitable as the pixel resolution in a measurement layer (in-plane resolution). The layer thickness of the first diagnostic scan Ma2 selected is preferably between 1 mm and 5 mm, preferably between 2 mm and 4 mm and particularly preferably 3 mm. The measurement layers exhibit a second layer orientation. The second layer orientation is preferably a sagittal layer orientation. The second layer orientation is preferably based on the positioning data determined in evaluation step Ea1. The second layer orientation is preferably aligned with the anatomy of the examination object and/or its knee and/or a symmetric axis of the receive unit.

The distance between two adjacent measurement layers is preferably between less than 50% of the layer thickness, preferably less than 30% of the layer thickness and particularly preferably 10% of the layer thickness. The distance between two adjacent measurement layers is preferably larger than 0% of the layer thickness. This can reduce cross-talk between neighboring measurement layers. Most preferably, the distance between two adjacent measurement layers is 5% of the layer thickness.

Typically, between 20 and 60 measurement layers, preferably between 30 and 50 measurement layers and particularly preferably between 35 and 40 measurement layers are acquired. The recording area of the first diagnostic scan Ma2 is preferably a volume which has a spatial expansion in the range of between 90 mm and 180 mm, preferably between 100 mm and 150 mm and particularly preferably between 110 mm and 130 mm perpendicular to a measurement layer, i.e. in third direction. The recording area of the first diagnostic scan Ma2 is preferably a volume which has a spatial expansion in the range of between 100 mm and 220 mm, preferably between 130 mm and 190 mm and particularly preferably between 150 mm and 170 mm in a measurement layer in a first direction. The recording area of the first diagnostic scan Ma2 preferably has a spatial expansion in the range of between 100 mm and 220 mm, preferably between 130 mm and 190 mm and particularly preferably between 150 mm and 170 mm in a second direction perpendicular to the first direction. The spatial expansion in the second direction is preferably equal to the spatial expansion in the first direction. Frequency coding is preferably used for spatial encoding of the first direction and phase coding is preferably used for spatial encoding of the second direction. The second direction of the first diagnostic scan Ma2 is preferably aligned with the proximal-distal axis of the knee of the examination object. This alignment of the second direction of the first diagnostic scan Ma2 reduces artifacts due to liquid, in particular to moving liquid like blood flow. The usage of a local coil unit for signal detection enclosing the field of view closely reduces folding artifacts in second direction even without phase oversampling. The amount of phase oversampling suggested for the first diagnostic scan Ma2 can additionally reduce the probability of folding artifacts. The amount of phase oversampling suggested for the first diagnostic scan Ma2 can additionally increase the signal-to-noise ratio.

In second direction, phase oversampling of an additional range beyond the spatial expansion of the area under examination may take place. The additional range is preferably between 10% and 80%, in particular preferably between 15% and 60%, most preferably between 25% and 35% of the spatial expansion of the area under examination in the second direction. This can reduce and/or eliminate fold artifacts and/or increase the signal-to-noise ratio of the resulting image data.

The number of voxels per measurement layer in the first direction is preferably between 128 and 512 and particularly preferably between 250 and 400, preferably 384. The number of voxels per measurement layer in the second direction preferably corresponds as a maximum to the number of voxels in the first direction, preferably the number of voxels in the direction perpendicular to the first direction is between 50% and 98%, preferably between 70% and 80% and particularly preferably 75% of the number of voxels in the first direction. The interpolation of voxels or zero-filling of the k-space in second direction can take place so that the interpolated voxels in the second direction are the same size as the voxels in the first direction.

The bandwidth of the frequency coding for the first diagnostic scan Ma2 is typically in the range of between 200 Hertz per pixel and 500 Hertz per pixel, preferably between 300 Hertz per pixel and 400 Hertz per pixel, particularly preferably between 335 Hertz and 365 Hertz. A high frequency pulse which is used for refocusing nuclear spins in the context of the first diagnostic scan Ma2 preferably produces a defined flip angle between 100° and 180° and particularly preferably between 110° and 140°, preferably of 125°.

The first diagnostic scan Ma2 is typically implemented as a TSE magnetic resonance sequence with a turbo factor between 5 and 20, preferably between 8 and 14, most preferably between 10 and 12. The first diagnostic scan Ma2 is typically implemented as a TSE magnetic resonance sequence with an echo spacing between 4 ms and 16 ms, preferably between 6 ms and 12 ms, most preferably between 8 ms and 9 ms. The first diagnostic scan Ma2 is typically implemented as a TSE magnetic resonance sequence with 5 to 30, preferably between 12 and 25, most preferably between 16 and 22 echo trains per measurement layer.

The turbo factor denotes the number of echoes generated after one high frequency pulse which is used for excitation of nuclear spins. The turbo factor can also be defined by the number of high frequency pulses used for refocusing of nuclear spins following one high frequency pulse which is used for excitation. The echo spacing denotes the time difference between two subsequent echoes initiated by one high frequency pulse which is used for excitation of nuclear spins. The echo spacing can also be defined as the time difference between two subsequent high frequency pulses used for refocusing of nuclear spins within one layer. The number of echo trains per measurement layer denotes the number of sets comprising one high frequency pulse used for excitation of nuclear spins and several high frequency pulses used for refocusing of nuclear spins, which sets are required to cover and/or acquire the measurement data for one image layer.

A period in the range of between 1000 ms and 8000 ms, preferably between 2000 ms and 5000 ms and particularly preferably of 3500 ms is preferably selected as the repetition time. A period in the range of between 20 ms and 100 ms, preferably between 25 ms to 60 ms and particularly preferably of 35 ms is preferably selected as the echo time.

Acceleration technology is preferably used for the first diagnostic scan Ma2. In particular, a combined use of parallel imaging and simultaneous multislice acceleration is conceivable for the first diagnostic scan Ma2. Simultaneous multislice acceleration is typically employed in slice direction, i.e. perpendicular to the measurement layers. Simultaneous multislice acceleration is preferably employed in the first diagnostic scan Ma2 with an acceleration factor of 4 at maximum, preferably 3 at maximum, particularly preferably 2. The acceleration factor in simultaneous multislice imaging typically denotes the number of measurement layers excited simultaneously by one high frequency pulse. During the first diagnostic scan Ma2, i.e. during the acquisition of the first diagnostic measurement data, gradient phase encoding in slice direction is used, preferably by the use of gradient blips in the third direction. This technique is also known as blipped CAIPIRINHA. Preferably, slice GRAPPA is used for the reconstruction and for resolving aliasing. The shift factor for simultaneous multislice acceleration is preferably between ⅙ and ½, most preferably ¼ of the field of view for the first diagnostic scan Ma2. Background information on this topic can be found in Barth, et al. "Simultaneous multislice (SMS) imaging techniques." Magnetic resonance in medicine 75.1 (2016): 63-81, the entire contents of which are hereby incorporated by reference.

Acceleration of the acquisition of measurement data within a measurement layer is preferably based on parallel imaging, particularly preferably based on GRAPPA. Acceleration of the acquisition of measurement data within a measurement layer can also be based on SENSE or CAIPIRINHA. Parallel imaging is preferably employed by the first diagnostic scan Ma2 with an acceleration factor of 4 at maximum, preferably 3 at maximum, particularly preferably 2. Parallel imaging is preferably used for accelerated acquisition of measurement data within one measurement layer of the several measurement layers in two-dimensional imaging. Background information on these techniques can be found in Griswold, et al. "Generalized autocalibrating partially parallel acquisitions (GRAPPA)." Magnetic Resonance in Medicine: An Official Journal of the International Society for Magnetic Resonance in Medicine 47.6 (2002): 1202-1210, Pruessmann, et al. "SENSE: sensitivity encoding for fast MRI." Magnetic resonance in medicine 42.5 (1999): 952-962, Breuer, et al. "Controlled aliasing in parallel imaging results in higher acceleration (CAIPIRINHA) for multi-slice imaging." Magnetic resonance in medicine 53.3 (2005): 684-691 the entire contents of each of which are hereby incorporated by reference.

Preferably, the total acceleration factor caused by parallel imaging in-plane and simultaneous multislice imaging in the first diagnostic scan Ma2 is between 2 and 6, more preferably between 3 and 5, most preferably 4. This is particularly preferably achieved by the use of a simultaneous multislice acceleration factor 2 and two-fold subsampling in parallel imaging, resulting in a total acceleration factor of 4 for the first diagnostic scan Ma2. For parallel imaging, GRAPPA is preferably used in the second direction and slice-GRAPPA is preferably used in the third direction. The shift factor for simultaneous multislice acceleration is preferably ¼ of the field of view. For the first diagnostic scan Ma2, the number of reference lines used for calibration of GRAPPA and slice-GRAPPA, i.e. in second direction and third direction, is preferably between 30 and 60, most preferably between 40 and 50, particularly preferable 47. This combination of parameters proves an ideal trade-off for the first diagnostic scan Ma2, balancing image quality, in particular signal-to-noise ratio, blurring and contrast, and the second period for the first diagnostic scan Ma2. In particular, the use of Compressed Sensing acceleration technology is conceivable as an alternative or in addition to the previously presented acceleration methods.

The aforementioned parameters concerning the magnetic resonance sequence to the first diagnostic scan Ma2 are advantageously selected such that the first diagnostic measurement data can be recorded in full with the magnetic resonance sequence used in less than 120 seconds, in particular in less than 100 seconds, advantageously in less than 80 seconds and most advantageously in less than 72 seconds. First image data reconstructed from the first diagnostic measurement data can be reconstructed and provided for diagnosis immediately after completion of the first diagnostic scan Ma2.

The second measuring block Ba2, in particular the first diagnostic scan Ma2, can be preferably used with a magnetic resonance device which has a main magnetic field with 1.5 Tesla. The specified ranges of the areas for parameters which are specified in the description of the second measuring block Ba2 for 3 Tesla are typically also applicable to other configurations. If the first diagnostic scan Ma2 is performed with a magnetic resonance device which has a main magnetic field with 1.5 Tesla, in particular the repetition time, the echo time, the bandwidth of the frequency coding, phase oversampling or the number of echo trains per measurement layer may change.

The repetition time at 1.5 Tesla is preferably 3200 ms and the echo time is preferably 26 ms. Due to the reduced repetition time at 1.5 Tesla, the number of echo trains per measurement layer may increase to preferably between 19 and 23, most preferably to 21. The additional range for phase oversampling is preferably slightly increased to 35% to 45% compared to 3 Tesla, which may increase the signal-to-noise ratio of the resulting image data. This increase of the signal-to-noise ratio can also be induced by a reduced bandwidth of the frequency coding, which is preferably between 230 Hertz per pixel and 260 Hertz per pixel at 1.5 Tesla. The number of measurement layers may be increased to 40, which in turn enlarge the recording area of the first diagnostic scan Ma2 in the third dimension by preferably between 5 mm and 10 mm. The resulting second period is typically between 70 seconds and 85 s seconds preferably 77 seconds.

Measuring Block Ba3

Following the second measuring block Ba2, at a third point in time Ta3, a third measuring block Ba3 starts during the first knee imaging. In the third measuring block Ba3, a second diagnostic scan Ma3 takes place during which second diagnostic measurement data is acquired.

The third point in time Ta3 in the case shown is 83 s after the starting time Ta1 of the first knee imaging. The third measuring block Ba3 in the case shown has a third period of 75 s. The third period is preferably between 50 seconds and 100 seconds, in particular between 62 and 88 seconds, in particular between 68 seconds and 82 seconds. The third period is preferably almost completely in the pure measurement period of the second diagnostic scan Ma3.

Furthermore, in the third measuring block Ba3 before the start of the second diagnostic scan Ma3 in preparation for the acquisition of the measurement data an adjustment measurement which, for example, comprises an adjustment of a transmitter and/or receiver voltage of the magnetic resonance device, can be performed. The adjustment measurement typically lasts 15 seconds maximum, in particular 8 seconds maximum, in particular 5 seconds maximum, in particular 2 seconds maximum. If an adjustment measurement is required, the third period is typically extended by the duration of the adjustment measurement.

A remaining period of the third measuring block Ba3 may be partly included in the preparation of the acquisition of the second diagnostic measurement data. For example, the recording area and/or the location of the measurement layers and/or the third layer orientation for the second diagnostic scan Ma3 can be determined on the basis of the positioning data determined in evaluation step Ea1. The remaining period of the third measuring block Ba3 can furthermore be partly included in an evaluation or subsequent processing of the second diagnostic measurement data.

The second diagnostic scan Ma3 may generate PD-weighted image data with fat suppression of the knee. To acquire the second diagnostic measurement data Ma3, a spin echo magnetic resonance sequence is preferably used which, for example, is implemented as a Turbo-spin-Echo (TSE) magnetic resonance sequence. The acquisition of the recording area for the second diagnostic scan Ma3 preferably takes place two-dimensionally, wherein various measurement layers in parallel to each other are recorded. A range of between 0.3 mm and 0.8 mm, and particularly preferably 0.5 mm, has proved suitable as the pixel resolution in a measurement layer (in-plane resolution). The layer thickness of the second diagnostic scan Ma3 selected is preferably between 1 mm and 5 mm, preferably between 2 mm and 4 mm and particularly preferably 3 mm. The measurement layers exhibit a third layer orientation. The third layer orientation is preferably a coronal layer orientation. The third layer orientation is preferably based on the positioning data determined in evaluation step Ea1. The third layer orientation is preferably aligned with the anatomy of the examination object and/or its knee and/or a symmetric axis of the receive unit.

For fat suppression, a high frequency pulse is typically used to invert the nuclear spins of the resonantly excited atoms which typically produces a flip angle of 180°. Preferably, the central frequency and the bandwidth of high frequency pulse are selected such that the nuclear spins of the resonantly excited atoms in fat tissue are inverted only. Preferably, the central frequency and the bandwidth of high frequency pulse are selected such that the nuclear spins of the resonantly excited atoms in tissue other than fat remain unmodified.

The high frequency pulse for inversion is typically output before an excitation pulse of the magnetic resonance sequence, wherein the period between the two pulses is described as the inversion time. Fat suppression used for the second diagnostic scan Ma3 is preferably based on the Spectral Attenuated Inversion Recovery (SPAIR) technique. Fat suppression used for the second diagnostic scan Ma3 can also be based on the Short TI Inversion Recovery (STIR) technique, spectral fat saturation and/or water excitation.

The distance between two adjacent measurement layers is preferably between less than 50% of the layer thickness, preferably less than 30% of the layer thickness and particularly preferably 10% of the layer thickness. The distance between two adjacent measurement layers is preferably larger than 0% of the layer thickness. This can reduce cross-talk between neighboring measurement layers. Most preferably, the distance between two adjacent measurement layers is 5% of the layer thickness.

Typically, between 20 and 50 measurement layers, preferably between 30 and 40 measurement layers and particularly preferably between 33 and 38 measurement layers are acquired. The recording area of the second diagnostic scan Ma3 is preferably a volume which has a spatial expansion in the range of between 90 mm and 150 mm, preferably between 100 mm and 135 mm and particularly preferably between 105 mm and 115 mm perpendicular to a measurement layer, i.e. in third direction. The recording area of the second diagnostic scan Ma3 is preferably a volume which has a spatial expansion in the range of between 100 mm and 220 mm, preferably between 130 mm and 190 mm and particularly preferably between 150 mm and 170 mm in a measurement layer in a first direction. The recording area of the second diagnostic scan Ma3 preferably has a spatial expansion in the range of between 100 mm and 220 mm, preferably between 130 mm and 190 mm and particularly preferably between 150 mm and 170 mm in a second direction perpendicular to the first direction. The spatial expansion in the second direction is preferably equal to the spatial expansion in the first direction. Frequency coding is preferably used for spatial encoding of the first direction and phase coding is preferably used for spatial encoding of the second direction. The second direction of the second diagnostic scan Ma3 is preferably aligned with proximal-distal axis of the knee of the examination object. This alignment of the second direction of the second diagnostic scan Ma3 reduces artifacts due to liquid, in particular to moving liquid like blood flow. The usage of a local coil unit for signal detection enclosing the field of view closely reduces folding artifacts in second direction even without phase oversampling. The amount of phase oversampling suggested for the second diagnostic scan Ma3 can additionally reduce the probability of folding artifacts. The amount of phase oversampling suggested for the second diagnostic scan Ma3 can additionally increase the signal-to-noise ratio.

In second direction, phase oversampling of an additional range beyond the spatial expansion of the area under examination may take place. The additional range is preferably between 50% and 200%, in particular preferably between 70% and 120%, most preferably between 85% and 100% of the spatial expansion of the area under examination in the second direction. This can reduce and/or eliminate fold artifacts and/or increase the signal-to-noise ratio of the resulting image data.

The number of voxels per measurement layer in the first direction is preferably between 128 and 512 and particularly preferably between 250 and 400, preferably 336. The number of voxels per measurement layer in the second direction preferably corresponds as a maximum to the number of voxels in the first direction, preferably the number of voxels in the direction perpendicular to the first direction is between 50% and 98%, preferably between 70% and 80% and particularly preferably 75% of the number of voxels in the first direction for the second diagnostic scan Ma3. The interpolation of voxels or zero-filling of the k-space in second direction can take place so that the interpolated voxels in the second direction are the same size as the voxels in the first direction.

The bandwidth of the frequency coding for the second diagnostic scan Ma3 is typically in the range of between 150 Hertz per pixel and 450 Hertz per pixel, preferably between 220 Hertz per pixel and 370 Hertz per pixel, particularly preferably between 280 Hertz and 320 Hertz. A high frequency pulse which is used for refocusing nuclear spins in the context of the second diagnostic scan Ma3 preferably produces a defined flip angle between 100° and 180° and particularly preferably between 110° and 140°, preferably of 125°.

The second diagnostic scan Ma3 is typically implemented as a TSE magnetic resonance sequence with a turbo factor between 5 and 20, preferably between 8 and 14, most preferably between 10 and 12. The second diagnostic scan Ma3 is typically implemented as a TSE magnetic resonance sequence with an echo spacing between 4 ms and 16 ms, preferably between 6 ms and 12 ms, most preferably between 7.5 ms and 8.5 ms. The second diagnostic scan Ma3 is typically implemented as a TSE magnetic resonance sequence with 10 to 35, preferably between 15 and 30, most preferably between 19 and 25 echo trains per measurement layer.

A period in the range of between 1000 ms and 8000 ms, preferably between 2000 ms and 4000 ms and particularly preferably of 3000 ms is preferably selected as the repetition time. A period in the range of between 20 ms and 100 ms, preferably between 25 ms to 55 ms and particularly preferably of 40 ms is preferably selected as the echo time.

Acceleration technology is preferably used for the second diagnostic scan Ma3. In particular, a combined use of parallel imaging and simultaneous multislice acceleration is conceivable. Simultaneous multislice acceleration is preferably employed with an acceleration factor of 4 at maximum, preferably 3 at maximum, particularly preferably 2. During the acquisition of measurement data, gradient phase encoding in slice direction is used, preferably by the use of gradient blips in the third direction. Preferably, slice GRAPPA is used for the reconstruction and for resolving aliasing. The shift factor for simultaneous multislice acceleration for the second diagnostic scan Ma3 is preferably between ⅙ and ½, most preferably ¼ of the field of view.

Acceleration of the second diagnostic scan Ma3 within a measurement layer is preferably based on parallel imaging, particularly preferably based on GRAPPA. Acceleration of the second diagnostic scan Ma3 within a measurement layer can also be based on SENSE or CAIPIRINHA. Parallel imaging is preferably employed with an acceleration factor of 4 at maximum, preferably 3 at maximum, particularly preferably 2.

Preferably, the total acceleration factor caused by parallel imaging in-plane and simultaneous multislice imaging in the second diagnostic scan Ma3 is between 2 and 6, more preferably between 3 and 5, most preferably 4. This is particularly preferably achieved by the use of a simultaneous multislice acceleration factor 2 and two-fold subsampling in parallel imaging, resulting in a total acceleration factor of 4. For parallel imaging, GRAPPA is preferably used in the second direction and slice-GRAPPA is preferably used in the third direction. The shift factor for simultaneous multislice acceleration is preferably ¼ of the field of view. For the second diagnostic scan Ma3, the number of reference lines used for calibration of GRAPPA and slice-GRAPPA, i.e. in second direction and third direction, is preferably between 30 and 60, most preferably between 40 and 50, particularly preferable 47. This combination of parameters proves an ideal trade-off for the second diagnostic scan Ma3, balancing image quality, in particular signal-to-noise ratio, blurring and contrast, and the second period for the second diagnostic scan Ma3. In particular, the use of Compressed Sensing acceleration technology is conceivable as an alternative or in addition to the previously presented acceleration methods.

The aforementioned parameters concerning the magnetic resonance sequence to the second diagnostic scan Ma3 are advantageously selected such that the second diagnostic measurement data can be recorded in full with the magnetic resonance sequence used in less than 120 seconds, in particular in less than 100 seconds, advantageously in less than 80 seconds and most advantageously in less than 76 seconds. Second image data reconstructed from the second diagnostic measurement data can be reconstructed and provided for diagnosis immediately after completion of the second diagnostic scan Ma3.

The third measuring block Ba3, in particular the second diagnostic scan Ma3, can be preferably used with a magnetic resonance device which has a main magnetic field with 1.5 Tesla. The specified ranges of the areas for parameters which are specified in the description of the third measuring block Ba3 for 3 Tesla are typically also applicable to other configurations. If the second diagnostic scan Ma3 is performed with a magnetic resonance device with a main magnetic field with a strength of 1.5 Tesla, the following parameters preferably change:
- the number of measurement layers is preferably increased from 36 to 38
- the repetition time is preferably 2800 ms instead of 3000 ms
- the echo time is preferably decreased from 40 ms to 28 ms
- the bandwidth selected for frequency coding is preferably in the range of between 150 Hertz per pixel and 250 Hertz per pixel, preferably 198 Hertz per pixel
- the additional range for phase oversampling is preferably decreased from 92% to between 80% and 85%
- the number of voxels per measurement layer in the first direction is preferably reduced from 336 to 320
- the ratio of the number of voxels per measurement layer in the second direction to the number of voxels per measurement layer in the first direction is preferably reduced to 70%,
- the first direction and the second direction may be interchanged resulting in a swap of direction for phase coding and frequency coding, such that the second direction is aligned along the mediolateral axis of the knee of the examination object
- the number of echo trains per measurement layer may be reduced from 22 to 19
- the echo spacing may be increased from 8 ms to 9.2 ms
- the resulting third period is typically between 70 seconds and 85 seconds, preferably 77 seconds.

Measuring Block Ba4

Following the third measuring block Ba3, at a fourth point in time Ta4, a fourth measuring block Ba4 starts during the first knee imaging. In the fourth measuring block Ba4, a third diagnostic scan Ma4 takes place during which third diagnostic measurement data is acquired.

The fourth point in time Ta4 in the case shown is 158 s after the starting time Ta1 of the first knee imaging. The fourth measuring block Ba4 in the case shown has a fourth period of 53 s. The fourth period is preferably between 35 seconds and 70 seconds, in particular between 45 and 65 seconds, in particular between 50 seconds and 55 seconds. The fourth period is preferably almost completely in the pure measurement period of the third diagnostic scan Ma4.

Furthermore, in the fourth measuring block Ba4 before the start of the third diagnostic scan Ma4 in preparation for the acquisition of the measurement data an adjustment measurement which, for example, comprises an adjustment of a transmitter and/or receiver voltage of the magnetic resonance device, can be performed. The adjustment measurement typically lasts 15 seconds maximum, in particular 8 seconds maximum, in particular 5 seconds maximum, in particular 2 seconds maximum. If an adjustment measurement is required, the fourth period is typically extended by the duration of the adjustment measurement.

A remaining period of the fourth measuring block Ba4 may be partly included in the preparation of the acquisition of the third diagnostic measurement data. For example, the recording area and/or the location of the measurement layers and/or the fourth layer orientation for the third diagnostic scan Ma4 can be determined on the basis of the positioning data determined in evaluation step Ea1. The remaining period of the fourth measuring block Ba4 can furthermore be partly included in an evaluation or subsequent processing of the third diagnostic measurement data.

The third diagnostic scan Ma4 may generate PD-weighted image data with fat suppression of the knee. To acquire the third diagnostic measurement data Ma4, a spin echo magnetic resonance sequence is preferably used which, for example, is implemented as a Turbo-spin-Echo (TSE) magnetic resonance sequence. The acquisition of the recording area for the third diagnostic scan Ma4 preferably takes place two-dimensionally, wherein various measurement layers in parallel to each other are recorded. A range of between 0.3 mm and 0.8 mm, and particularly preferably 0.5 mm, has proved suitable as the pixel resolution in a measurement layer (in-plane resolution). The layer thickness of the third diagnostic scan Ma4 selected is preferably between 1 mm and 5 mm, preferably between 2 mm and 4 mm and particularly preferably 3 mm. The measurement layers exhibit a fourth layer orientation. The fourth layer orientation is preferably a transversal layer orientation. The fourth layer orientation is preferably based on the positioning data determined in evaluation step Ea1. The fourth layer orientation is preferably aligned with the anatomy of the examination object and/or its knee and/or a symmetric axis of the receive unit.

For fat suppression, a high frequency pulse is typically used to invert the nuclear spins of the resonantly excited atoms which typically produces a flip angle of 180°. Preferably, the central frequency and the bandwidth of high frequency pulse are selected such that the nuclear spins of the resonantly excited atoms in fat tissue are inverted only. Preferably, the central frequency and the bandwidth of high frequency pulse are selected such that the nuclear spins of the resonantly excited atoms in tissue other than fat remain unmodified.

The high frequency pulse for inversion is typically output before an excitation pulse of the magnetic resonance sequence, wherein the period between the two pulses is described as the inversion time. Fat suppression used for the third diagnostic scan Ma4 is preferably based on the SPAIR technique. Fat suppression used for the third diagnostic scan Ma4 can also be based on the STIR technique, spectral fat saturation and/or water excitation.

The distance between two adjacent measurement layers is preferably between less than 50% of the layer thickness, preferably less than 30% of the layer thickness and particularly preferably 10% of the layer thickness. The distance between two adjacent measurement layers is preferably larger than 0% of the layer thickness. This can reduce cross-talk between neighboring measurement layers. Most preferably, the distance between two adjacent measurement layers is 5% of the layer thickness.

Typically, between 25 and 55 measurement layers, preferably between 33 and 43 measurement layers and particularly preferably between 35 and 40 measurement layers are acquired. The recording area of the third diagnostic scan Ma4 is preferably a volume which has a spatial expansion in the range of between 90 mm and 150 mm, preferably between 110 mm and 130 mm and particularly preferably between 115 mm and 125 mm perpendicular to a measurement layer, i.e. in third direction. The recording area of the third diagnostic scan Ma4 is preferably a volume which has a spatial expansion in the range of between 100 mm and 220 mm, preferably between 130 mm and 190 mm and particularly preferably between 150 mm and 170 mm in a measurement layer in a first direction. The recording area of the third diagnostic scan Ma4 preferably has a spatial expansion in the range of between 100 mm and 220 mm, preferably between 130 mm and 190 mm and particularly preferably between 150 mm and 170 mm in a second direction perpendicular to the first direction. The spatial expansion in the second direction is preferably equal to the spatial expansion in the first direction. Frequency coding is preferably used for spatial encoding of the first direction and phase coding is preferably used for spatial encoding of the second direction. The second direction of the third diagnostic scan Ma4 is preferably aligned with the mediolateral axis of the knee of the examination object. This alignment of the second direction of the third diagnostic scan Ma4 combined with the usage of a local coil unit for signal detection enclosing the field of view closely avoids folding artifacts from the second knee of the examination object not subject to examination even without phase oversampling. The amount of phase oversampling suggested for the third diagnostic scan Ma4 can additionally increase the signal-to-noise ratio.

In second direction, phase oversampling of an additional range beyond the spatial expansion of the area under examination may take place. The additional range is preferably between 10% and 100%, in particular preferably between 20% and 70%, most preferably between 30% and 50% and particularly preferably 37% of the spatial expansion of the area under examination in the second direction. This can reduce and/or eliminate fold artifacts and/or increase the signal-to-noise ratio of the resulting image data.

The number of voxels per measurement layer in the first direction is preferably between 128 and 512 and particularly preferably between 250 and 400, preferably 336. The number of voxels per measurement layer in the second direction preferably corresponds as a maximum to the number of voxels in the first direction, preferably the number of voxels in the direction perpendicular to the first direction is between 50% and 98%, preferably between 70% and 80% and particularly preferably 75% of the number of voxels in the first direction for the third diagnostic scan Ma4. The interpolation of voxels or zero-filling of the k-space in second direction can take place so that the interpolated voxels in the second direction are the same size as the voxels in the first direction.

The bandwidth of the frequency coding for the third diagnostic scan Ma4 is typically in the range of between 150 Hertz per pixel and 450 Hertz per pixel, preferably between 220 Hertz per pixel and 370 Hertz per pixel, particularly preferably between 280 Hertz and 320 Hertz. A high frequency pulse which is used for refocusing nuclear spins in the context of the third diagnostic scan Ma4 preferably produces a defined flip angle between 100° and 180° and particularly preferably between 110° and 140°, preferably of 125°.

The third diagnostic scan Ma4 is typically implemented as a TSE magnetic resonance sequence with a turbo factor between 5 and 20, preferably between 8 and 14, most preferably between 10 and 12. The third diagnostic scan Ma4 is typically implemented as a TSE magnetic resonance sequence with an echo spacing between 4 ms and 16 ms, preferably between 6 ms and 12 ms, most preferably between 7.5 ms and 8.5 ms. The third diagnostic scan Ma4 is typically implemented as a TSE magnetic resonance sequence with 5 to 25, preferably between 10 and 20, most preferably between 14 and 16 echo trains per measurement layer.

A period in the range of between 1000 ms and 8000 ms, preferably between 2000 ms and 4000 ms and particularly preferably of 3000 ms is preferably selected as the repetition time. A period in the range of between 17 ms and 50 ms, preferably between 25 ms to 38 ms and particularly preferably of 31 ms is preferably selected as the echo time.

Acceleration technology is preferably used for the third diagnostic scan Ma4. In particular, a combined use of parallel imaging and simultaneous multislice acceleration is conceivable. Simultaneous multislice acceleration is preferably employed with an acceleration factor of 4 at maximum, preferably 3 at maximum, particularly preferably 2. During the acquisition of measurement data, gradient phase encoding in slice direction is used, preferably by the use of gradient blips in the third direction. Preferably, slice GRAPPA is used for the reconstruction and for resolving aliasing. The shift factor for simultaneous multislice acceleration for the third diagnostic scan Ma4 is preferably between ⅙ and ½, most preferably ¼ of the field of view.

Acceleration of the third diagnostic scan Ma4 within a measurement layer is preferably based on parallel imaging, particularly preferably based on GRAPPA. Acceleration of the third diagnostic scan Ma4 within a measurement layer can also be based on SENSE or CAIPIRINHA. Parallel imaging is preferably employed with an acceleration factor of 4 at maximum, preferably 3 at maximum, particularly preferably 2.

Preferably, the total acceleration factor caused by parallel imaging in-plane and simultaneous multislice imaging in the third diagnostic scan Ma4 is between 2 and 6, more preferably between 3 and 5, most preferably 4. This is particularly preferably achieved by the use of a simultaneous multislice acceleration factor 2 and two-fold subsampling in parallel imaging, resulting in a total acceleration factor of 4. For parallel imaging, GRAPPA is preferably used in the second direction and slice-GRAPPA is preferably used in the third direction. The shift factor for simultaneous multislice acceleration is preferably ¼ of the field of view. For the third diagnostic scan Ma4, the number of reference lines used for calibration of GRAPPA and slice-GRAPPA, i.e. in second direction and third direction, is preferably between 30 and 55, most preferably between 38 and 48, particularly preferable 42. This combination of parameters proves an ideal trade-off for the third diagnostic scan Ma4, balancing image quality, in particular signal-to-noise ratio, blurring and contrast, and the second period for the third diagnostic scan Ma4. In particular, the use of Compressed Sensing acceleration technology is conceivable as an alternative or in addition to the previously presented acceleration methods.

The aforementioned parameters concerning the magnetic resonance sequence to the third diagnostic scan Ma4 are advantageously selected such that the third diagnostic measurement data can be recorded in full with the magnetic resonance sequence used in less than 70 seconds, in particular in less than 60 seconds, advantageously in less than 55 seconds. Third image data reconstructed from the third diagnostic measurement data can be reconstructed and provided for diagnosis immediately after completion of the third diagnostic scan Ma4.

The fourth measuring block Ba4, in particular the third diagnostic scan Ma4, can be preferably used with a magnetic resonance device which has a main magnetic field with 1.5 Tesla. The specified ranges of the areas for parameters which are specified in the description of the fourth measuring block Ba4 for 3 Tesla are typically also applicable to other configurations. If the third diagnostic scan Ma4 is performed with a magnetic resonance device with a main magnetic field with a strength of 1.5 Tesla, the following parameters preferably change:

the repetition time is preferably 2780 ms instead of 3000 ms the echo time is preferably decreased from 31 ms to 18 ms the bandwidth selected for frequency coding is preferably in the range of between 150 Hertz per pixel and 250 Hertz per pixel, preferably 200 Hertz per pixel the additional range for phase oversampling is preferably increased from 37% to between 50% and 65% the number of voxels per measurement layer in the first direction is preferably reduced from 320 to 288 the number of interpolated voxels per measurement layer in the second direction is preferably reduced from 320 to 288, while the ratio of the number of voxels per measurement layer in the second direction to the number of voxels per measurement layer in the first direction remains constant the spatial expansion of the recording area in the first direction is preferably reduced from 160 mm to 150 mm, while the voxel size remains constant the spatial expansion of the recording area in the second direction is preferably reduced from 160 mm to 150 mm, while the interpolated voxel size remains constant the number of echo trains per measurement layer may be increased from 15 to 17 the echo spacing may be increased from 7.8 ms to 9.0 ms the resulting fourth period is typically between 50 seconds and 60 seconds, preferably 54 seconds.

Measuring Block Ba5

Following the fourth measuring block Ba4, at a fifth point in time Ta5, a fifth measuring block Ba5 starts during the first knee imaging. In the fifth measuring block Ba5, a fourth diagnostic scan Ma5 takes place during which fourth diagnostic measurement data is acquired.

The fifth point in time Ta5 in the case shown is 211 s after the starting time Ta1 of the first knee imaging. The fifth measuring block Ba5 in the case shown has a fifth period of 20 s. The fifth period is preferably between 5 seconds and 50 seconds, in particular between 12 and 30 seconds, in particular between 18 seconds and 23 seconds. The fifth period is preferably almost completely in the pure measurement period of the fourth diagnostic scan Ma5.

Furthermore, in the fifth measuring block Ba5 before the start of the fourth diagnostic scan Ma5 in preparation for the acquisition of the measurement data an adjustment measurement which, for example, comprises an adjustment of a transmitter and/or receiver voltage of the magnetic resonance device, can be performed. The adjustment measurement typically lasts 15 seconds maximum, in particular 8 seconds maximum, in particular 5 seconds maximum, in particular 2 seconds maximum. If an adjustment measurement is required, the fifth period is typically extended by the duration of the adjustment measurement.

A remaining period of the fifth measuring block Ba5 may be partly included in the preparation of the acquisition of the fourth diagnostic measurement data. For example, the recording area and/or the location of the measurement layers and/or the fifth layer orientation for the fourth diagnostic scan Ma5 can be determined on the basis of the positioning data determined in evaluation step Ea1. The remaining period of the fifth measuring block Ba5 can furthermore be partly included in an evaluation or subsequent processing of the fourth diagnostic measurement data.

The fourth diagnostic scan Ma5 may generate T1-weighted image data of the knee. To acquire the fourth diagnostic measurement data Ma5, a spin echo magnetic resonance sequence is preferably used which, for example, is implemented as a Turbo-spin-Echo (TSE) magnetic resonance sequence. The acquisition of the recording area for the fourth diagnostic scan Ma5 preferably takes place two-dimensionally, wherein various measurement layers in parallel to each other are recorded. A range of between 0.3 mm and 0.9 mm, preferably a range of between 0.45 mm and 0.75 mm and particularly preferably 0.6 mm, has proved suitable as the pixel resolution in a measurement layer (in-plane resolution). The layer thickness of the fourth diagnostic scan Ma5 selected is preferably between 1 mm and 7 mm, preferably between 2.5 mm and 4.5 mm and particularly preferably 3.5 mm. The measurement layers exhibit a fifth layer orientation. The fifth layer orientation is preferably a coronal layer orientation. The fifth layer orientation is preferably based on the positioning data determined in evaluation step Ea1. The fifth layer orientation is preferably aligned with the anatomy of the examination object and/or its knee and/or a symmetric axis of the receive unit.

The distance between two adjacent measurement layers is preferably between less than 50% of the layer thickness, preferably less than 30% of the layer thickness and particularly preferably 10% of the layer thickness. The distance between two adjacent measurement layers is preferably larger than 0% of the layer thickness. This can reduce cross-talk between neighboring measurement layers.

Typically, between 20 and 40 measurement layers, preferably between 25 and 32 measurement layers and particularly preferably between 26 and 30 measurement layers are acquired. The recording area of the fourth diagnostic scan Ma5 is preferably a volume which has a spatial expansion in the range of between 80 mm and 140 mm, preferably between 90 mm and 120 mm and particularly preferably between 100 mm and 110 mm perpendicular to a measurement layer, i.e. in third direction. The recording area of the fourth diagnostic scan Ma5 is preferably a volume which has a spatial expansion in the range of between 100 mm and 220 mm, preferably between 130 mm and 190 mm and particularly preferably between 150 mm and 170 mm in a measurement layer in a first direction. The recording area of the fourth diagnostic scan Ma5 preferably has a spatial expansion in the range of between 100 mm and 220 mm, preferably between 130 mm and 190 mm and particularly preferably between 150 mm and 170 mm in a second direction perpendicular to the first direction. The spatial expansion in the second direction is preferably equal to the spatial expansion in the first direction. Frequency coding is preferably used for spatial encoding of the first direction and phase coding is preferably used for spatial encoding of the second direction. The second direction of the fourth diagnostic scan Ma5 is preferably aligned with the mediolateral axis of the knee of the examination object. This alignment of the second direction of the fourth diagnostic scan Ma5 combined with the usage of a local coil unit for signal detection enclosing the field of view closely avoids folding artifacts even without phase oversampling. The amount of phase oversampling suggested for the fourth diagnostic scan Ma5 can additionally increase the signal-to-noise ratio.

In second direction, phase oversampling of an additional range beyond the spatial expansion of the area under examination may take place. The additional range is preferably between 0% and 40%, in particular preferably between 5% and 20%, most preferably between 8% and 17% of the spatial expansion of the area under examination in the second direction. This can reduce and/or eliminate fold artifacts and/or increase the signal-to-noise ratio of the resulting image data.

The number of voxels per measurement layer in the first direction is preferably between 200 and 360 and particularly preferably between 260 and 300, preferably 288. The number of voxels per measurement layer in the second direction preferably corresponds as a maximum to the number of voxels in the first direction, preferably the number of voxels in the direction perpendicular to the first direction is between 40% and 98%, preferably between 60% and 80% and particularly preferably 70% of the number of voxels in the first direction for the fourth diagnostic scan Ma5. The interpolation of voxels or zero-filling of the k-space in second direction can take place so that the interpolated voxels in the second direction are the same size as the voxels in the first direction.

The bandwidth of the frequency coding for the fourth diagnostic scan Ma5 is typically in the range of between 250 Hertz per pixel and 450 Hertz per pixel, preferably between 300 Hertz per pixel and 400 Hertz per pixel, particularly preferably between 330 Hertz and 370 Hertz. A high frequency pulse which is used for refocusing nuclear spins in the context of the fourth diagnostic scan Ma5 preferably produces a defined flip angle between 100° and 180° and particularly preferably between 110° and 140°, preferably of 125°.

The fourth diagnostic scan Ma5 is typically implemented as a TSE magnetic resonance sequence with a turbo factor between 1 and 10, preferably between 2 and 7, most preferably between 3 and 5. The fourth diagnostic scan Ma5 is typically implemented as a TSE magnetic resonance sequence with an echo spacing between 4 ms and 16 ms, preferably between 6 ms and 12 ms, most preferably between 7 ms and 8 ms. The fourth diagnostic scan Ma5 is typically implemented as a TSE magnetic resonance sequence with 15 to 40, preferably between 22 and 36, most preferably between 27 and 31 echo trains per measurement layer.

A period in the range of between 300 ms and 700 ms, preferably between 400 ms and 600 ms and particularly preferably of 500 ms is preferably selected as the repetition time. A period in the range of between 2 ms and 15 ms, preferably between 4 ms to 10 ms and particularly preferably of 7.5 ms is preferably selected as the echo time.

Acceleration technology is preferably used for the fourth diagnostic scan Ma5. In particular, a combined use of parallel imaging and simultaneous multislice acceleration is conceivable. Simultaneous multislice acceleration is preferably employed with an acceleration factor of 4 at maximum, preferably 3 at maximum, particularly preferably 2. During the acquisition of measurement data, gradient phase encoding in slice direction is used, preferably by the use of gradient blips in the third direction. Preferably, slice GRAPPA is used for the reconstruction and for resolving aliasing. The shift factor for simultaneous multislice acceleration for the fourth diagnostic scan Ma5 is preferably between ⅙ and ½, most preferably ¼ of the field of view for the fourth diagnostic scan Mb5.

Acceleration of the fourth diagnostic scan Ma5 within a measurement layer is preferably based on parallel imaging, particularly preferably based on GRAPPA. Acceleration of the fourth diagnostic scan Ma5 within a measurement layer can also be based on SENSE or CAIPIRINHA. Parallel imaging is preferably employed with an acceleration factor of 4 at maximum, preferably 3 at maximum, particularly preferably 2.

Preferably, the total acceleration factor caused by parallel imaging in-plane and simultaneous multislice imaging in the fourth diagnostic scan Ma5 is between 2 and 6, more preferably between 3 and 5, most preferably 4. This is particularly preferably achieved by the use of a simultaneous multislice acceleration factor 2 and two-fold subsampling in parallel imaging, resulting in a total acceleration factor of 4. For parallel imaging, GRAPPA is preferably used in the second direction and slice-GRAPPA is preferably used in the third direction. The shift factor for simultaneous multislice acceleration is preferably ¼ of the field of view. For the fourth diagnostic scan Ma5, the number of reference lines used for calibration of GRAPPA and slice-GRAPPA, i.e. in second direction and third direction, is preferably between 30 and 60, most preferably between 40 and 50, particularly preferable 47. This combination of parameters proves an ideal trade-off for the fourth diagnostic scan Ma5, balancing image quality, in particular signal-to-noise ratio, blurring and contrast, and the second period for the fourth diagnostic scan Ma5. In particular, the use of Compressed Sensing acceleration technology is conceivable as an alternative or in addition to the previously presented acceleration methods.

The aforementioned parameters concerning the magnetic resonance sequence to the fourth diagnostic scan Ma5 are advantageously selected such that the fourth diagnostic measurement data can be recorded in full with the magnetic resonance sequence used in less than 40 seconds, in particular in less than 30 seconds, advantageously in less than 25 seconds and most advantageously in less than 21 seconds. Fourth image data reconstructed from the fourth diagnostic measurement data can be reconstructed and provided for diagnosis immediately after completion of the fourth diagnostic scan Ma5.

The fifth measuring block Ba5, in particular the fourth diagnostic scan Ma5, can be preferably used with a magnetic resonance device which has a main magnetic field with 1.5 Tesla. The specified ranges of the areas for parameters which are specified in the description of the fifth measuring block Ba5 for 3 Tesla are typically also applicable to other configurations. If the fourth diagnostic scan Ma5 is performed with a magnetic resonance device with a main magnetic field with a strength of 1.5 Tesla, the following parameters preferably change:

the number of measurement layers is increased from 28 to 36 the layer thickness is preferably decreased from 3.5 mm to 3 mm the distance between two adjacent measurement layers is preferably 5% of the layer thickness the spatial expansion of the recording area in the third direction is preferably increased from 107 mm to 113 mm the additional range for phase oversampling is preferably increased from 12% to 42% the number of voxels per measurement layer in the first direction is preferably reduced from 288 to 256, while the voxel size increases in the first direction the number of interpolated voxels per measurement layer in the second direction is preferably reduced from 288 to 256, while the voxel size increases in the second direction the first direction and the second direction may be interchanged resulting in a swap of direction for phase coding and frequency coding, such that the second direction is aligned along the proximal-distal axis of the knee of the examination object the repetition time is preferably 549 ms instead of 508 ms the echo time is preferably increased from 7.5 ms to 7.8 ms the bandwidth selected for frequency coding is preferably 241 Hertz per pixel the turbo factor may be reduced from 4 to 3 the echo spacing may be increased from 7.5 ms to 8.0 ms the number of echo trains per measurement layer may be increased from 29 to 43 the resulting fifth period is typically between 25 seconds and 35 seconds, preferably 29 seconds.

Measuring Block Ba6

Following the fifth measuring block Ba5, at a sixth point in time Ta6, a sixth measuring block Ba6 starts during the first knee imaging. In the sixth measuring block Ba6, a fifth diagnostic scan Ma6 takes place during which fifth diagnostic measurement data is acquired.

The sixth point in time Ta6 in the case shown is 231 s after the starting time Ta1 of the first knee imaging. The sixth measuring block Ba6 in the case shown has a sixth period of 69 s. The sixth period is preferably between 40 seconds and 100 seconds, in particular between 55 and 85 seconds, in particular between 62 seconds and 76 seconds. The sixth period is preferably almost completely in the pure measurement period of the fifth diagnostic scan Ma6.

Furthermore, in the sixth measuring block Ba6 before the start of the fifth diagnostic scan Ma6 in preparation for the acquisition of the measurement data an adjustment measurement which, for example, comprises an adjustment of a transmitter and/or receiver voltage of the magnetic resonance device, can be performed. The adjustment measurement typically lasts 15 seconds maximum, in particular 8 seconds maximum, in particular 5 seconds maximum, in particular 2 seconds maximum. If an adjustment measurement is required, the sixth period is typically extended by the duration of the adjustment measurement.

A remaining period of the sixth measuring block Ba6 may be partly included in the preparation of the acquisition of the fifth diagnostic measurement data. For example, the recording area and/or the location of the measurement layers and/or the sixth layer orientation for the fifth diagnostic scan Ma6 can be determined on the basis of the positioning data determined in evaluation step Ea1. The remaining period of the sixth measuring block Ba6 can furthermore be partly included in an evaluation or subsequent processing of the fifth diagnostic measurement data.

The fifth diagnostic scan Ma6 may generate T2-weighted image data with fat suppression of the knee. Dependent on the exact selection of echo time and/or a subjective habit of the evaluating user, the fifth diagnostic scan Ma6 may generate PD-weighted image data with fat suppression and/or a mixture of PD-weighted and T2-weighted image data with fat suppression. To acquire the fifth diagnostic measurement data Ma6, a spin echo magnetic resonance sequence is preferably used which, for example, is implemented as a Turbo-spin-Echo (TSE) magnetic resonance sequence. The acquisition of the recording area for the fifth diagnostic scan Ma6 preferably takes place two-dimensionally, wherein various measurement layers in parallel to each other are recorded. A range of between 0.3 mm and 0.8 mm, and particularly preferably 0.5 mm, has proved suitable as the pixel resolution in a measurement layer (in-plane resolution). The layer thickness of the fifth diagnostic scan Ma6 selected is preferably between 1 mm and 5 mm, preferably between 2 mm and 4 mm and particularly preferably 3 mm. The measurement layers exhibit a sixth layer orientation. The sixth layer orientation is preferably a sagittal layer orientation. The sixth layer orientation is preferably based on the positioning data determined in evaluation step Ea1. The sixth layer orientation is preferably aligned with the anatomy of the examination object and/or its knee and/or a symmetric axis of the receive unit.

For fat suppression, a high frequency pulse is typically used to invert the nuclear spins of the resonantly excited atoms which typically produces a flip angle of 180°. Preferably, the central frequency and the bandwidth of high frequency pulse are selected such that the nuclear spins of the resonantly excited atoms in fat tissue are inverted only. Preferably, the central frequency and the bandwidth of high frequency pulse are selected such that the nuclear spins of the resonantly excited atoms in tissue other than fat remain unmodified.

The high frequency pulse for inversion is typically output before an excitation pulse of the magnetic resonance sequence, wherein the period between the two pulses is described as the inversion time. Fat suppression used for the fifth diagnostic scan Ma6 is preferably based on the SPAIR technique. Fat suppression used for the fifth diagnostic scan Ma6 can also be based on the STIR technique, spectral fat saturation and/or water excitation.

The distance between two adjacent measurement layers is preferably between less than 50% of the layer thickness, preferably less than 30% of the layer thickness and particularly preferably 10% of the layer thickness. The distance between two adjacent measurement layers is preferably larger than 0% of the layer thickness. This can reduce cross-talk between neighboring measurement layers. Most preferably, the distance between two adjacent measurement layers is 5% of the layer thickness.

Typically, between 25 and 55 measurement layers, preferably between 32 and 46 measurement layers and particularly preferably between 36 and 40 measurement layers are acquired. The recording area of the fifth diagnostic scan Ma6 is preferably a volume which has a spatial expansion in the range of between 90 mm and 150 mm, preferably between 105 mm and 135 mm and particularly preferably between 115 mm and 125 mm perpendicular to a measurement layer, i.e. in third direction. The recording area of the fifth diagnostic scan Ma6 is preferably a volume which has a spatial expansion in the range of between 100 mm and 220 mm, preferably between 130 mm and 190 mm and particularly preferably between 150 mm and 170 mm in a measurement layer in a first direction. The recording area of the fifth diagnostic scan Ma6 preferably has a spatial expansion in the range of between 100 mm and 220 mm, preferably between 130 mm and 190 mm and particularly preferably between 150 mm and 170 mm in a second direction perpendicular to the first direction. The spatial expansion in the second direction is preferably equal to the spatial expansion in the first direction. Frequency coding is preferably used for spatial encoding of the first direction and phase coding is preferably used for spatial encoding of the second direction.

The second direction of the fifth diagnostic scan Ma6 is preferably aligned with the proximal-distal axis of the knee of the examination object. This alignment of the second direction of the fifth diagnostic scan Ma6 reduces artifacts due to liquid, in particular to moving liquid like blood flow. The usage of a local coil unit for signal detection enclosing the field of view closely reduces folding artifacts in second direction even without phase oversampling. The amount of phase oversampling suggested for the fifth diagnostic scan Ma6 can additionally reduce the probability of folding artifacts. The amount of phase oversampling suggested for the fifth diagnostic scan Ma6 can additionally increase the signal-to-noise ratio.

In second direction, phase oversampling of an additional range beyond the spatial expansion of the area under examination may take place. The additional range is preferably between 50% and 100%, in particular preferably between 60% and 90%, most preferably between 70% and 80% of the spatial expansion of the area under examination in the second direction. This can reduce and/or eliminate fold artifacts and/or increase the signal-to-noise ratio of the resulting image data.

The number of voxels per measurement layer in the first direction is preferably between 128 and 512 and particularly preferably between 250 and 400, preferably 336. The number of voxels per measurement layer in the second direction preferably corresponds as a maximum to the number of voxels in the first direction, preferably the number of voxels in the direction perpendicular to the first direction is between 50% and 98%, preferably between 70% and 80% and particularly preferably 75% of the number of voxels in the first direction for the fifth diagnostic scan Ma6. The interpolation of voxels or zero-filling of the k-space in second direction can take place so that the interpolated voxels in the second direction are the same size as the voxels in the first direction.

The bandwidth of the frequency coding for the fifth diagnostic scan Ma6 is typically in the range of between 150 Hertz per pixel and 450 Hertz per pixel, preferably between 220 Hertz per pixel and 370 Hertz per pixel, particularly preferably between 280 Hertz and 320 Hertz. A high frequency pulse which is used for refocusing nuclear spins in the context of the fifth diagnostic scan Ma6 preferably produces a defined flip angle between 100° and 180° and particularly preferably between 110° and 140°, preferably of 125°.

The fifth diagnostic scan Ma6 is typically implemented as a TSE magnetic resonance sequence with a turbo factor between 5 and 20, preferably between 8 and 14, most preferably between 10 and 12. The fifth diagnostic scan Ma6 is typically implemented as a TSE magnetic resonance sequence with an echo spacing between 4 ms and 16 ms, preferably between 6 ms and 12 ms, most preferably between 7.5 ms and 8.5 ms. The fifth diagnostic scan Ma6 is typically implemented as a TSE magnetic resonance sequence with 10 to 30, preferably between 15 and 25, most preferably between 18 and 22 echo trains per measurement layer.

A period in the range of between 1000 ms and 8000 ms, preferably between 2000 ms and 4000 ms and particularly preferably of 3000 ms is preferably selected as the repetition time. A period in the range of between 20 ms and 100 ms, preferably between 45 ms to 65 ms and particularly preferably of 56 ms is preferably selected as the echo time.

Acceleration technology is preferably used for the fifth diagnostic scan Ma6. In particular, a combined use of parallel imaging and simultaneous multislice acceleration is conceivable. Simultaneous multislice acceleration is preferably employed with an acceleration factor of 4 at maximum, preferably 3 at maximum, particularly preferably 2. During the acquisition of measurement data, gradient phase encoding in slice direction is used, preferably by the use of gradient blips in the third direction. Preferably, slice GRAPPA is used for the reconstruction and for resolving aliasing. The shift factor for simultaneous multislice acceleration for the fifth diagnostic scan Ma6 is preferably between ⅙ and ½, most preferably ¼ of the field of view.

Acceleration of the fifth diagnostic scan Ma6 within a measurement layer is preferably based on parallel imaging, particularly preferably based on GRAPPA. Acceleration of the fifth diagnostic scan Ma6 within a measurement layer can also be based on SENSE or CAIPIRINHA. Parallel imaging is preferably employed with an acceleration factor of 4 at maximum, preferably 3 at maximum, particularly preferably 2.

Preferably, the total acceleration factor caused by parallel imaging in-plane and simultaneous multislice imaging in the fifth diagnostic scan Ma6 is between 2 and 6, more preferably between 3 and 5, most preferably 4. This is particularly preferably achieved by the use of a simultaneous multislice acceleration factor 2 and two-fold subsampling in parallel imaging, resulting in a total acceleration factor of 4. For parallel imaging, GRAPPA is preferably used in the second direction and slice-GRAPPA is preferably used in the third direction. The shift factor for simultaneous multislice acceleration is preferably ¼ of the field of view. For the fifth diagnostic scan Ma6, the number of reference lines used for calibration of GRAPPA and slice-GRAPPA, i.e. in second direction and third direction, is preferably between 30 and 60, most preferably between 40 and 50, particularly preferable 47. This combination of parameters proves an ideal trade-off for the fifth diagnostic scan Ma6, balancing image quality, in particular signal-to-noise ratio, blurring and contrast, and the second period for the fifth diagnostic scan Ma6. In particular, the use of Compressed Sensing acceleration technology is conceivable as an alternative or in addition to the previously presented acceleration methods.

The aforementioned parameters concerning the magnetic resonance sequence to the fifth diagnostic scan Ma6 are advantageously selected such that the fifth diagnostic measurement data can be recorded in full with the magnetic resonance sequence used in less than 100 seconds, in particular in less than 90 seconds, advantageously in less than 80 seconds and most advantageously in less than 70 seconds. Fifth image data reconstructed from the fifth diagnostic measurement data can be reconstructed and provided for diagnosis immediately after completion of the fifth diagnostic scan Ma6.

The sixth measuring block Ba6 ends at the seventh point in time Ta7. The seventh point in time Ta7 thus constitutes an end to the acquisition of the measurement data and an end to the evaluation in the first knee imaging shown. The seventh point in time Ta7 thus concludes the first knee imaging. The seventh point in time Ta7 in the case shown is 300 s after the starting time Ta1 of the first knee imaging.

The sixth measuring block Ba6, in particular the fifth diagnostic scan Ma6, can be preferably used with a magnetic resonance device which has a main magnetic field with 1.5 Tesla. The specified ranges of the areas for parameters which are specified in the description of the sixth measuring block Ba6 for 3 Tesla are typically also applicable to other configurations. If the fifth diagnostic scan Ma6 is performed with a magnetic resonance device with a main magnetic field with a strength of 1.5 Tesla, the following parameters preferably change:
- the repetition time is preferably 2800 ms instead of 3000 ms
- the echo time is preferably decreased from 56 ms to 28 ms
- the bandwidth selected for frequency coding is preferably in the range of between 150 Hertz per pixel and 250 Hertz per pixel, preferably 198 Hertz per pixel
- the additional range for phase oversampling is preferably increased from 74% to between 80% and 85%
- the number of voxels per measurement layer in the first direction is preferably reduced from 336 to 320
- the number of interpolated voxels per measurement layer in the second direction is preferably reduced from 336 to 320
- the ratio of the number of voxels per measurement layer in the second direction to the number of voxels per measurement layer in the first direction is preferably reduced to 70%,
- the number of echo trains per measurement layer may be reduced from 20 to 19
- the echo spacing may be increased from 8 ms to 9.2 ms
- the resulting sixth period is typically between 55 seconds and 65 seconds, preferably 61 seconds.

Ratio of Recording Parameters Between Diagnostic Scans

The magnetic resonance sequences used for the recordings Ma1, Ma2, Ma3, Ma4, Ma5, Ma6 have characteristic properties and/or characteristic dependencies which relate to various parameters. For example, the sampling of the k-space for all the recordings Ma1, Ma2, Ma3, Ma4, Ma5, Ma6 takes place in a Cartesian manner. The diagnostic scans Ma2, Ma3, Ma4, Ma5, Ma6 preferably take place two-dimensionally by acquisition of parallel layers. The first overview scan Ma1 preferably takes place three-dimensionally. Preferably, the overview scan Ma1 is based on a different magnetic resonance sequence than at least one diagnostic scan of the diagnostic scans Ma2, Ma3, Ma4, Ma5, Ma6. Preferably, the overview scan Ma1 is based on a different magnetic resonance sequence than all diagnostic scans Ma2, Ma3, Ma4, Ma5, Ma6.

Preferably, the overview scan Ma1 is the only scan of the recordings Ma1, Ma2, Ma3, Ma4, Ma5, Ma6 to provide isotropic resolution. Preferably, the ratio of the spatial expansion to layer thickness of the diagnostic recordings Ma2, Ma3, Ma4, Ma5, Ma6 is less than 20%, more preferably less than 18%. Preferably, the resolution of the fourth diagnostic scan Ma5 is characterized by the highest ratio of the spatial expansion to layer thickness of all diagnostic recordings Ma2, Ma3, Ma4, Ma5, Ma6. Preferably, the resolution of the first diagnostic scan Ma2 is characterized by the lowest ratio of the spatial expansion to layer thickness of all diagnostic recordings Ma2, Ma3, Ma4, Ma5, Ma6. Preferably, the resolution within a measurement layer of the fourth diagnostic scan Ma5 is lowest resolution of all diagnostic scans Ma2, Ma3, Ma4, Ma5, Ma6.

Preferably, all diagnostic scans Ma2, Ma3, Ma4, Ma5, Ma6 acquire less measurement data in the second direction than in the first direction. Preferably, all diagnostic scans Ma2, Ma3, Ma4, Ma5, Ma6 acquire at least 10%, more preferably at least 20% less measurement data in the second direction than in the first direction. Typically, all diagnostic measurement data in second direction is interpolated to result in diagnostic image data with an equal amount of voxels in first direction and second direction and/or to result in diagnostic image data with equally sized voxels in first direction and second direction. The number of voxels per measurement layer in the second direction preferably corresponds as a maximum to the number of voxels in the first direction, preferably the number of voxels in the direction perpendicular to the first direction is between 50% and 98%, preferably between 70% and 80% and particularly preferably 75% of the number of voxels in the first direction.

Preferably, the diagnostic scans with fat suppression Ma3, Ma4, Ma6 have a lower resolution within a measurement layer than the first diagnostic scan Ma2. Preferably, at least 50%, more preferably at least 65%, most preferably at least 80% of the diagnostic scans Ma2, Ma3, Ma4, Ma5, Ma6 have the same layer thickness. Preferably, at least 70%, more preferably at least 85%, most preferably at least 95% of the diagnostic scans Ma2, Ma3, Ma4, Ma5, Ma6 have the same spatial expansion in first direction and/or third direction.

The diagnostic scans Ma2, Ma3, Ma4, Ma5, Ma6 are advantageous because a high spatial resolution is available for three different measurement layers. Diagnostic scans Ma2, Ma5 generating proton density and T1-weighted contrasts are suitable for a morphological analysis of structures. Diagnostic scans with fat saturation Ma3, Ma4, Ma6 provide improved contrast and/or improved signal-to-noise ratio due to the lower resolution, enabling the diagnosis of fluid, edema pattern and acute injuries as well as inflammation.

Phase oversampling of an additional range beyond the spatial expansion of the area under examination in third direction preferably differs for all diagnostic scans Ma2, Ma3, Ma4, Ma5, Ma6. Diagnostic scans where the second direction is aligned with the mediolateral axis of the knee of the examination object typically have less phase oversampling than diagnostic scans where the second direction is aligned with the proximal-distal axis of the knee of the examination object.

Preferably, the flip angle induced by the high frequency pulse used for refocusing of nuclear spins in the context of at least one diagnostic scan of the diagnostic scans Ma2, Ma3, Ma4, Ma5, Ma6, more preferably of all diagnostic scans Ma2, Ma3, Ma4, Ma5, Ma6 is at least ten times larger than the flip angle induced by the high frequency pulse used for excitation of nuclear spins in the context of the overview scan Ma1.

Preferably, the overview scan Ma1 has a higher ratio of the echo time to the repetition time than all diagnostic scans Ma2, Ma3, Ma4, Ma5, Ma6. Preferably, the fourth diagnostic scan Ma5 has the lowest ratio of the echo time to the repetition time of all diagnostic scans Ma2, Ma3, Ma4, Ma5, Ma6.

Preferably, at least four scans of the diagnostic scans Ma2, Ma3, Ma4, Ma5, Ma6 have a repetition time, which is at least five times as high as the repetition time of one other scan of the diagnostic scans Ma2, Ma3, Ma4, Ma5, Ma6. Preferably, at least four scans of the diagnostic scans Ma2, Ma3, Ma4, Ma5, Ma6 have an echo time, which is at least four times as high as the echo time of one other scan of the diagnostic scans Ma2, Ma3, Ma4, Ma5, Ma6.

The diagnostic scans Ma2, Ma3, Ma4, Ma5, Ma6 are preferably all accelerated by an acceleration factor of 4. The diagnostic scans Ma2, Ma3, Ma4, Ma5, Ma6 are preferably all accelerated by an acceleration method combining simultaneous multislice and parallel imaging.

Preferably, the turbo factor of at least three, more preferably of at least four diagnostic scans of the diagnostic scans Ma2, Ma3, Ma4, Ma5, Ma6 differs by less than 20%, more preferably by less than 10%. Preferably, the turbo factor of two diagnostic scans of the diagnostic scans Ma2, Ma3, Ma4, Ma5, Ma6 differs by at least 50%, more preferably by a least 60%.

Preferably, the recording parameters disregarding the layer orientation of the diagnostic scans Ma3 and Ma6 show highest similarity. Disregarding the layer orientation, only phase oversampling in third direction preferably differs by a maximum of 50%, the number of measurement layers differs by less than 7% and echo time differs between 25% and 40%, resulting in slightly differing acquisition times.

These dependencies of recording parameters enable particularly advantageous contrasts of the diagnostic measurement data, or diagnostic image data, based on which a particularly reliable diagnosis can be made and/or a particularly short first imaging period which is within the aforementioned limits.

If the spatial expansion and/or the in-plane resolution and/or the layer thickness and/or the distance between adjacent measurement layers corresponds for the same layer orientation of different diagnostic recordings, the various diagnostic scans are particularly easily comparable: such diagnostic image data shows the same sections of the area under examination in different contrasts, whereby a tissue and/or an anatomy and/or a pathology can be identified with particular precision.

Based on the quadratic expansion of a measurement layer, in other words, of a corresponding spatial expansion in the first direction and in the second direction, the efficiency of such a magnetic resonance sequence can be put to particularly good use in recording a large amount of measurement data and thereby increasing the signal-to-noise ratio of the resulting image data.

If the number of voxels in the second direction is less than the spatial expansion in the first direction for a diagnostic scan of the diagnostic scans Ma2-Ma6, then the diagnostic scan is typically based on a spin echo magnetic resonance sequence, in particular on a TSE. This is advantageous as the period of such a magnetic resonance sequence for recording diagnostic measurement data is determined, in particular, by the number of voxels in the second direction and a reduction in the number of voxels in the second direction can bring about a reduction of the corresponding period. With full coverage of the examination object in an anterior-posterior direction, fold artifacts can be particularly efficiently avoided and the period reduced.

The resolution of the overview measurement data is preferably isotropic. A layer thickness preferably corresponds to recordings of diagnostic measurement data which are recorded with the same layer orientation. Thereby, the diagnostic measurement data which is recorded with the same layer orientation and same layer thickness are particularly easily comparable. The layer orientation of at least two recordings of the recordings Ma2-Ma6 of the diagnostic measurement data is different. This makes possible at least two different views of the area under examination, these views preferably also having different contrasts.

The bandwidth of the frequency coding for the second, third and for the fifth diagnostic scan Ma3, Ma4, Ma6 is typically lower than the bandwidth of the frequency coding for the first and fourth diagnostic scan Ma2, Ma5.

The bandwidth of the frequency coding for at least one of the second, third and fifth diagnostic scan Ma3, Ma4, Ma6 is typically lower by at least 10% than the bandwidth of the frequency coding for at least one of the first and fourth diagnostic scan Ma2, Ma5. The bandwidth of the frequency coding for at least one diagnostic scan with fat saturation is lower than at least one diagnostic scan without fat saturation. Preferably, the bandwidth of the frequency coding for all diagnostic scans with fat saturation of the diagnostic scans Ma2-Ma6 is lower than for all diagnostic scans without fat saturation of the diagnostic scans Ma2-Ma6.

The lower signal-to-noise ratio produced diagnostic scans with fat saturation compared to diagnostic scans with fat saturation Ma3, Ma4, Ma6 can be compensated by the lower bandwidth of the frequency coding compared to diagnostic scans without fat saturation Ma3, Ma4, Ma6. Diagnostic scans without fat saturation Ma3, Ma4, Ma6 can employ a higher bandwidth of the frequency coding, reducing artifacts, particularly due to motion. The signal-to-noise ratio typically relates inversely to the. These dependencies of the bandwidth of the frequency coding enable a particularly good signal-to-noise ratio of the diagnostic measurement data, or diagnostic image data, based on which a particularly reliable diagnosis can be made and/or a particularly short first imaging period which is within the aforementioned limits.

Temporal Sequence of the Diagnostic Scans

The first knee imaging is characterized in that a maximum of one first user interaction Ia1 is necessary at the start of the first knee imaging. Measuring block Ba1 is required as first Measuring block of the first knee imaging to provide reproducible and automatic positioning of measurement layers in the subsequent measuring blocks Ba2, Ba3, Ba4, Ba5, Ba6. The subsequent measuring blocks Ba2, Ba3, Ba4, Ba5, Ba6 take place automatically, enabling the user to monitor the embodiment of the methods, for example. The temporal sequence of the measuring blocks Ba2, Ba3, Ba4, Ba5, Ba6 can be selected as required. The temporal sequence of the measuring blocks Ba2, Ba3, Ba4, Ba5, Ba6 can be permuted compared to the temporal sequence as depicted in FIG. 1. The sequence of the measuring blocks Ba2-Ba6 is preferably selected such that the measurement data recorded by the measuring blocks Ba2-Ba6 and image data that can be reconstructed from it is in descending order of importance for the user. Thus, measurement data of particular relevance for a diagnosis can be recorded at an earlier time at which the patient is more cooperative and/or the probability of the patient moving is lower, whereby the quality of the diagnostic measurement data can be increased. The first knee imaging may have to be terminated early, for example, due to emergencies or claustrophobia of the patient. The sequence of the measuring blocks Ba2-Ba6 is thus not selected according to their single clinical importance. The sequence of the measuring blocks Ba2-Ba6 is selected to provide the most informative combination at each point in time during the first knee imaging.

Measuring block Ba2 provides a PD-weighted contrast in sagittal direction. The combination of contrast and orientation of the second measuring block Ba2 allows a detailed evaluation of the articular cartilage, medial lateral menisci, extensor mechanism, and anterior and posterior cruciate ligaments. As these evaluations are essential for orthopedic diagnoses, which predominantly are aimed for in knee imaging, it is beneficial to acquire respective diagnostic measurement data as early as possible in the course of the first knee imaging. Measuring block Ba3 provides a PD-weighted contrast with fat saturation in coronal direction. The combination of contrast and orientation of the third measuring block Ba3 allows a detailed evaluation of the median lateral collateral ligament and fractures. These evaluations are crucial for a diagnosis in the field of orthopedics. Measuring block Ba4 provides a PD-weighted contrast with fat saturation in axial direction. The combination of contrast and orientation of the fourth measuring block Ba4 is supplementary to the second measuring block Ba2 and third measuring block Ba3. Measuring blocks Ba2, Ba3, Ba4 allow together a detailed evaluation of the patellofemoral joint and the medial and lateral patellofemoral ligaments. Measuring block Ba5 provides a T1-weighted contrast in coronal direction. The combination of contrast and orientation of the fifth measuring block Ba5 allows excellent evaluation of the bone marrow and facilitates the detection of fractures. Thus, the combination of measurement data of measuring blocks Ba3 and Ba5 provides an optimal basis for the evaluation of fractures. Measuring block Ba6 provides a T2-weighted contrast with fat saturation in sagittal direction. The combination of contrast and orientation of the sixth measuring block Ba6 is supplementary to the second measuring block Ba2 and third measuring block Ba3 and allows a comprehensive evaluation of the knee of the examination object.

Irrespective of the temporal sequence of the measuring blocks Ba2-Ba6, the contrasts and orientations of reconstructed diagnostic image data allow a comprehensive evaluation of the knee. The parameters proposed for the measuring blocks Ba2-Ba6 enable an excellent tradeoff between duration required for the acquisition of the respective measurement data and quality of the diagnostic image data. This is also enabled by the automatic workflow not requiring any user interaction after the starting time Ta1 of the first knee imaging.

In another embodiment, the sequence of the measuring blocks Ba2-Ba6 can be selected such that diagnostic scans of consistent orientation can be combined in one block and the at least two blocks are executed one after the other. Thereby the probability of the patient moving between two diagnostic scans of the same orientation, in other words, two diagnostic scans of the same block, is reduced, whereby the two diagnostic scans of the same orientation can be better compared with each other and in particular also depicted superimposed and/or a subtraction can be performed. The sequence of the blocks and/or the sequence of the diagnostic scans within a block can be selected as required. It is thereby possible to individually adjust the sequence to the requirements of the user.

Ratio of the Periods of the Diagnostic Scans and the Overview Scan

The period of the third measuring block Ba3 is typically longer than the period of the second measuring block Ba2.

The period of the third measuring block Ba3 is typically longer than the period of the sixth measuring block Ba6. The period of the sixth measuring block Ba6 and the period of the second measuring block Ba2 typically differ by less than 5%, preferably by less than 2%. The period of the sixth measuring block Ba6 is typically longer than the period of the fourth measuring block Ba4. The period of the second measuring block Ba2 is typically longer than the period of the fourth measuring block Ba4. The period of the fourth measuring block Ba4 is typically longer than the period of the fifth measuring block Ba5. The period of the fifth measuring block Ba5 is typically longer than the period of the first measuring block Ba1.

The period of the first measuring block Ba1 and of the fifth measuring block Ba5 combined is preferably shorter than the period of the second measuring block Ba2 or the period of the third measuring block Ba3 or the period of the sixth measuring block Ba6. The period of the first measuring block Ba1 and of the fourth measuring block Ba4 combined is preferably shorter than the period of the second measuring block Ba2 or the period of the third measuring block Ba3 or the period of the sixth measuring block Ba6. The period of the second measuring block Ba2 and of the fourth measuring block Ba4 combined is preferably longer than the period of the first measuring block Ba1 or the period of the third measuring block Ba3 or the period of the fifth measuring block Ba5 or the period of the sixth measuring block Ba6. The period of the second measuring block Ba2 and of the fifth measuring block Ba5 combined is preferably longer than the period of the first measuring block Ba1 or the period of the third measuring block Ba3 or the period of the fourth measuring block Ba4 or the period of the sixth measuring block Ba6. The period of any two of the second measuring block Ba2, the fourth measuring block Ba4 and the sixth measuring block Ba6 combined is preferably longer than the period of any two of the first measuring block Ba1, the second measuring block Ba2 and the fifth measuring block Ba5 combined. The period of all measuring blocks comprising a module for fat suppression combined is longer than the period of all measuring blocks not comprising a module for fat suppression combined. The period of the third measuring block Ba3, the fourth measuring block Ba4 and the sixth measuring block Ba6 combined is preferably longer than the period of the first measuring block Ba1, the second measuring block Ba2 and the fifth measuring block Ba5 combined. The period of the third measuring block Ba3, the fourth measuring block Ba4 and the sixth measuring block Ba6 combined constitute of more than 50% of the total duration of the first knee imaging. The period of the third measuring block Ba3 is the longest period of all measuring blocks comprising a module for fat suppression. The period of the second measuring block Ba2 is the longest period of all measuring blocks not comprising a module for fat suppression. The two measuring blocks lasting the longest are preferably structured such that the recording of the corresponding measurement data takes place with fat suppression. This is particularly advantageous as a magnetic resonance sequence with a module for fat saturation typically lasts longer than a magnetic resonance sequence without a module for fat saturation.

The sum of the durations of the measurement blocks Ba2, Ba6 acquiring measurement data with a sagittal layer orientation is preferably longer than the sum of the durations of the measurement blocks Ba3, Ba5 acquiring measurement data with a coronal layer orientation. The sum of the durations of the measurement blocks Ba2, Ba6 acquiring measurement data with a sagittal layer orientation is preferably longer than the duration of the measurement block Ba4 acquiring measurement data with an axial layer orientation.

The period of a measuring block typically comprises the recording period of the measuring block and if applicable, a period of reconstruction, insofar as the reconstruction of the measurement data is performed within the measuring block which may, in particular, be applicable to overview measurement data. The reconstruction period of the overview measurement data is typically 20% maximum, preferably 10% maximum and particularly preferably 5% maximum of the recording period of the overview measurement data Ma1. The period of the reconstruction diagnostic measurement data is typically at least 1 s and/or 10% maximum, preferably 5% maximum and particularly preferably 3% maximum of the recording period of the diagnostic measurement data Ma2-Ma6.

FIG. 2—Second Knee Imaging

General Information about the Second Knee Imaging

The second knee imaging, the sequence of which is shown in FIG. 2, in particular provides diagnostic measurement data which can provide a complete set of diagnostic image data. The complete set of diagnostic image data comprises all contrasts and layer orientations, a trained radiologist might have been trained with in the field of knee imaging. The complete set of diagnostic image data comprises for each of the three layer orientations at least two different contrasts. Based on the diagnostic image data generated by the second knee imaging, different radiologists, even if trained differently, can diagnose a wide range of diseases and pathologies of the knee of the examination object. The second knee imaging thus serves a wide range of users. Even little trained users or radiologists may identify diseases and pathologies of the knee of the examination object based on the diagnostic image data generated by the second knee imaging.

As in the first knee imaging, in particular, it is an aim of the second knee imaging to record the diagnostic measurement data required for the assessment of the anatomy and/or pathology of the knee of the examination object in a short second imaging period, compared with traditional comparable examinations of the knee by a magnetic resonance device. The diagnostic measurement data is preferably recorded in the short second imaging period such that sufficiently high-quality image data can be ascertained and provided as the basis for a diagnosis of the knee despite the comparatively short second imaging period.

The second knee imaging has a second imaging period which is from a starting time Tb1 of the second knee imaging to an eighth point in time Tb8, at which the recording of measurement data in the second knee imaging is completed. If the second knee imaging is performed by a magnetic resonance device with a main magnetic field with a strength of 3 Tesla, the second imaging period advantageously lasts a maximum of 9 minutes, in particular advantageously a maximum of 8 minutes, particularly advantageously a maximum of 7 minutes. If a maximum imaging period is established, the user has planning security for the period and/or feasibility of the second knee imaging.

The second imaging period is, in particular, dependent on the choice of receive unit which is used to receive magnetic resonance signals. The higher the number of individual receive channels the receive unit has, the shorter the second imaging period can be. A variability of the second imaging period is, in particular, analogous to the specified areas, or to the variability for the periods of the measuring blocks comprising the second imaging. The second imaging period is, in particular, arranged as a maximum imaging period which ideally is not exceeded for the performance of the second knee imaging. A period of user interactions or parameter settings for the acquisition of measurement data can be included in the second imaging period. In certain cases, it is also conceivable that a period of patient positioning is included in the second imaging period. Alternatively, the second imaging period can also be characterized in that more than 60 percent, in particular more than 75 percent, most advantageously more than 90 percent of a series of several examinations in the clinical routine which are performed in accordance with the diagram shown in FIG. 2 for the second knee imaging include the second imaging period.

FIG. 2 shows a particularly advantageous case in which the second imaging period of the second knee imaging lasts less than 7 minutes. After recording of the measurement data has been completed in the second knee imaging, further time may elapse in which subsequent processing and/or evaluation of the measurement data takes place. However, the examination object must only remain in the magnetic resonance device during the second imaging period. After the second imaging period, the next examination object can be positioned in the magnetic resonance device, whereby better utilization of the device is achieved.

Description of a Possible Concrete Sequence of the Second Knee Imaging

Preparation of the Second Knee Imaging

The preparation of the second knee imaging may in principle comprise some or all the elements already described for the preparation of the first knee imaging. Therefore, with regard to the description of the preparation of the second knee imaging, please refer to the description of the preparation of the first knee imaging.

Sequence of the Measuring Blocks

The first measuring block Bb1 of the second knee imaging is analogous to the first measuring block Ba1 of the first knee imaging. The second measuring block Bb2 of the second knee imaging is analogous to the second measuring block Ba2 of the first knee imaging. The third measuring block Bb3 of the second knee imaging is analogous to the third measuring block Ba3 of the first knee imaging. The fourth measuring block Bb4 of the second knee imaging is analogous to the fourth measuring block Ba4 of the first knee imaging. The fifth measuring block Bb5 of the second knee imaging is analogous to the fifth measuring block Ba5 of the first knee imaging.

The sixth measuring block Bb6 of the second knee imaging is analogous to the sixth measuring block Ba6 of the first knee imaging.

Therefore, reference is made to the description of the corresponding measuring blocks in the first knee imaging for the description of the measuring blocks Bb1, Bb2, Bb3, Bb4, Bb5, Bb6. Likewise, for the ratios of the recording parameters between the diagnostic scans Bb1, Bb2, Bb3, Bb4, Bb5, Bb6, reference is made to the description of the corresponding measuring blocks in the first knee imaging. Likewise, for the ratio of the period of the diagnostic scans Bb1, Bb2, Bb3, Bb4, Bb5, Bb6 and the overview scan, reference is made to the description of the corresponding measuring blocks in the first knee imaging.

The sequence of the seven measuring blocks Bb1, Bb2, Bb3, Bb4, Bb5, Bb6, Bb7 of the second knee imaging is briefly summarized at this point, wherein with regard to further descriptions and alternative expiry options for the measuring blocks Bb1, Bb2, Bb3, Bb4, Bb5, Bb6, reference is made to the description of the measuring blocks Ba1, Ba2, Ba3, Ba4, Ba5, Ba6 in FIG. 1. The measuring blocks Bb1, Bb2, Bb3, Bb4, Bb5, Bb6, Bb7 can be performed in any order.

Measuring Block Bb1

The second knee imaging shown starts at a first point in time Tb1 or starting time Tb1 with the first measuring block Bb1. In the first measuring block Ba1 a first user interaction Ib1, a first overview scan Mb1, takes place during which first overview measurement data is acquired, and a first evaluation step Eb1 analogous to the first user interaction Ia1, the first overview scan Ma1 and the first evaluation step Ea1, wherein positioning data can be extracted. The positioning data can be provided for the following recordings Mb2, Mb3, Mb4, Mb5, Mb6, Mb7. Based on the positioning data, further measures can be taken in the context of the first evaluation step Eb1 analogous to the first evaluation step Ea1. The first measuring block Bb1 ends at the point in time Tb2. The point in time Tb2 in the case shown is 13 s after the starting time Tb1 of the second knee imaging.

Measuring Block Bb2

The second measuring block Bb2 begins at the point in time Tb2. In the second measuring block Bb2 a first diagnostic scan Mb2 takes place which is arranged as a PD-weighted image of the knee and corresponds to the first diagnostic scan Ma2 of the first knee imaging. The second measuring block Bb2 ends at the point in time Tb3. The point in time Tb3 in the case shown is 83 s after the starting time Tb1 of the second knee imaging.

Measuring Block Bb3

The third measuring block Bb3 begins at the point in time Tb3. In the third measuring block Bb3 a second diagnostic scan Mb3 takes place which is arranged as a PD-weighted image of the knee with fat suppression and corresponds to the third diagnostic scan Ma4 of the first knee imaging. The third measuring block Bb3 ends at the point in time Tb4. The fourth point in time Tb4 in the case shown is 158 s after the starting time Tb1 of the second knee imaging.

Measuring Block Bb4

The fourth measuring block Bb4 begins at the point in time Tb4. In the fourth measuring block Bb4 a third diagnostic scan Mb4 takes place which is arranged as a PD-weighted image of the knee with fat suppression and corresponds to the fourth diagnostic scan Ma5 of the first knee imaging. The fourth measuring block Bb4 ends at the point in time Tb5. The point in time Tb5 in the case shown is 211 s after the starting time Tb1 of the second knee imaging.

Measuring Block Bb5

The fifth measuring block Bb5 begins at the point in time Tb5. In the fifth measuring block Bb5 a fourth diagnostic scan Mb5 takes place which is arranged as a T1-weighted image of the knee and corresponds to the fourth diagnostic scan Ma5 of the first knee imaging. The fifth measuring block Bb5 ends at the point in time Tb6. The point in time Tb6 in the case shown is 231 s after the starting time Tb1 of the second knee imaging.

Measuring Block Bb6

The sixth measuring block Bb6 begins at the point in time Tb3. In the sixth measuring block Bb6 a fifth diagnostic scan Mb6 takes place which is arranged as a T2-weighted image of the knee with fat suppression and corresponds to the fifth diagnostic scan Ma6 of the first knee imaging. The sixth measuring block Bb6 ends at the point in time Tb7. The point in time Tb7 in the case shown is 300 s after the starting time Tb1 of the second knee imaging.

Measuring Block Bb7

Following the sixth measuring block Bb6, at a seventh point in time Tb7, a seventh measuring block Bb7 starts during the second knee imaging. In the seventh measuring block Bb7, a sixth diagnostic scan Mb7 takes place during which sixth diagnostic measurement data is acquired.

The seventh point in time Tb7 in the case shown is 300 s after the starting time Tb1 of the second knee imaging. The seventh measuring block Bb7 in the case shown has a seventh period of 72 s. The seventh period is preferably between 40 seconds and 100 seconds, in particular between 50 and 90 seconds, in particular between 65 seconds and 75 seconds. The seventh period is preferably almost completely in the pure measurement period of the sixth diagnostic scan Mb7.

Furthermore, within the seventh measuring block Bb7 before the start of the sixth diagnostic scan Mb7 in preparation for the acquisition of measurement data, adjustment measurements can be performed which, for example, comprise the adjustment of a transmitter and receiver voltage of the magnetic resonance device. The adjustment measurement typically lasts 15 seconds maximum, in particular 8 seconds maximum, in particular 5 seconds maximum, in particular 2 seconds maximum. If an adjustment measurement is required, the seventh period is typically extended by the duration of the adjustment measurement.

A remaining period of the seventh measuring block Bb7 may be partly included in the preparation of the acquisition of the sixth diagnostic measurement data. For example, the recording area and/or the location of the measurement layers and/or the layer orientation for the sixth diagnostic scan Mb7 can be determined on the basis of the positioning data determined in evaluation step Ea1. The remaining period of the seventh measuring block Bb7 can furthermore be partly included in an evaluation or subsequent processing of the sixth diagnostic measurement data.

The sixth diagnostic scan Mb7 may generate PD-weighted image data of the knee. To acquire the sixth diagnostic measurement data Mb7, a spin echo magnetic resonance sequence is preferably used which, for example, is implemented as a Turbo-spin-Echo (TSE) magnetic resonance sequence. The acquisition of the recording area for the sixth diagnostic scan Mb7 preferably takes place two-dimensionally, wherein various measurement layers in parallel to each other are recorded. A range of between 0.2 mm and 0.7 mm, a range preferably between 0.3 mm and 0.5 mm and particularly preferably 0.4 mm, has proved suitable as the pixel resolution in a measurement layer (in-plane resolution). The layer thickness of the sixth diagnostic scan Mb7 selected is preferably between 1 mm and 5 mm, preferably between 2 mm and 4 mm and particularly preferably 3 mm. The measurement layers exhibit a seventh layer orientation. The seventh layer orientation is preferably an axial layer orientation. The seventh layer orientation is preferably based on the positioning data determined in evaluation step Ea1. The seventh layer orientation is preferably aligned with the anatomy of the examination object and/or its knee and/or a symmetric axis of the receive unit.

The distance between two adjacent measurement layers is preferably between less than 50% of the layer thickness, preferably less than 30% of the layer thickness and particularly preferably 10% of the layer thickness. The distance between two adjacent measurement layers is preferably larger than 0% of the layer thickness. This can reduce cross-talk between neighboring measurement layers. Most preferably, the distance between two adjacent measurement layers is 5% of the layer thickness.

Typically, between 20 and 60 measurement layers, preferably between 30 and 50 measurement layers and particularly preferably between 35 and 40 measurement layers are acquired. The recording area of the sixth diagnostic scan Mb7 is preferably a volume which has a spatial expansion in the range of between 90 mm and 180 mm, preferably between 100 mm and 150 mm and particularly preferably between 110 mm and 130 mm perpendicular to a measurement layer, i.e. in third direction. The recording area of the sixth diagnostic scan Mb7 is preferably a volume which has a spatial expansion in the range of between 100 mm and 220 mm, preferably between 130 mm and 190 mm and particularly preferably between 145 mm and 165 mm in a measurement layer in a first direction. The recording area of the sixth diagnostic scan Mb7 preferably has a spatial expansion in the range of between 100 mm and 220 mm, preferably between 130 mm and 190 mm and particularly preferably between 145 mm and 165 mm in a second direction perpendicular to the first direction. The spatial expansion in the second direction is preferably equal to the spatial expansion in the first direction. Frequency coding is preferably used for spatial encoding of the first direction and phase coding is preferably used for spatial encoding of the second direction. The second direction of the sixth diagnostic scan Mb7 preferably connects an anterior and a posterior position of the knee of the examination object. This alignment of the second direction of the sixth diagnostic scan Mb7 combined with the usage of a local coil unit for signal detection enclosing the field of view closely avoids folding artifacts from the second knee of the examination object not subject to examination even without phase oversampling. The amount of phase oversampling suggested for the sixth diagnostic scan Mb7 can additionally increase the signal-to-noise ratio.

In second direction, phase oversampling of an additional range beyond the spatial expansion of the area under examination may take place. The additional range is preferably between 10% and 80%, in particular preferably between 20% and 60%, most preferably between 30% and 45% of the spatial expansion of the area under examination in the second direction. This can reduce and/or eliminate fold artifacts and/or increase the signal-to-noise ratio of the resulting image data.

The number of voxels per measurement layer in the first direction is preferably between 128 and 512 and particularly preferably between 250 and 400, preferably 384. The number of voxels per measurement layer in the second direction preferably corresponds as a maximum to the number of voxels in the first direction, preferably the number of voxels in the direction perpendicular to the first direction is between 50% and 98%, preferably between 70% and 80% and particularly preferably 75% of the number of voxels in the first direction. The interpolation of voxels or zero-filling of the k-space in second direction can take place so that the interpolated voxels in the second direction are the same size as the voxels in the first direction.

The bandwidth of the frequency coding for the sixth diagnostic scan Mb7 is typically in the range of between 200 Hertz per pixel and 500 Hertz per pixel, preferably between 300 Hertz per pixel and 400 Hertz per pixel, particularly preferably between 335 Hertz and 365 Hertz. A high frequency pulse which is used for refocusing nuclear spins in the context of the sixth diagnostic scan Mb7 preferably produces a defined flip angle between 100° and 180° and particularly preferably between 110° and 140°, preferably of 125°.

The sixth diagnostic scan Mb7 is typically implemented as a TSE magnetic resonance sequence with a turbo factor between 5 and 20, preferably between 8 and 14, most preferably between 10 and 12. The sixth diagnostic scan Mb7 is typically implemented as a TSE magnetic resonance sequence with an echo spacing between 4 ms and 16 ms, preferably between 6 ms and 12 ms, most preferably between 8 ms and 9 ms. The sixth diagnostic scan Mb7 is typically implemented as a TSE magnetic resonance sequence with 5 to 30, preferably between 12 and 25, most preferably between 16 and 22 echo trains per measurement layer.

A period in the range of between 1000 ms and 8000 ms, preferably between 2000 ms and 5000 ms and particularly preferably of 3550 ms is preferably selected as the repetition time. A period in the range of between 20 ms and 100 ms, preferably between 25 ms to 60 ms and particularly preferably of 35 ms is preferably selected as the echo time.

Acceleration technology is preferably used for the sixth diagnostic scan Mb7. In particular, a combined use of parallel imaging and simultaneous multislice acceleration is conceivable for the sixth diagnostic scan Mb7. Simultaneous multislice acceleration is preferably employed in the sixth diagnostic scan Mb7 with an acceleration factor of 4 at maximum, preferably 3 at maximum, particularly preferably 2. During the sixth diagnostic scan Mb7, i.e. during the acquisition of the sixth diagnostic measurement data, gradient phase encoding in slice direction is used, preferably by the use of gradient blips in the third direction. Preferably, slice GRAPPA is used for the reconstruction and for resolving aliasing. The shift factor for simultaneous multislice acceleration is preferably between ⅙ and ½, most preferably ¼ of the field of view for the sixth diagnostic scan Mb7.

Acceleration of the acquisition of measurement data within a measurement layer is preferably based on parallel imaging, particularly preferably based on GRAPPA. Acceleration of the acquisition of measurement data within a measurement layer can also be based on SENSE or CAIPIRINHA. Parallel imaging is preferably employed by the sixth diagnostic scan Mb7 with an acceleration factor of 4 at maximum, preferably 3 at maximum, particularly preferably 2.

Preferably, the total acceleration factor caused by parallel imaging in-plane and simultaneous multislice imaging in the sixth diagnostic scan Mb7 is between 2 and 6, more preferably between 3 and 5, most preferably 4. This is particularly preferably achieved by the use of a simultaneous multislice acceleration factor 2 and two-fold subsampling in parallel imaging, resulting in a total acceleration factor of 4 for the sixth diagnostic scan Mb7. For parallel imaging, GRAPPA is preferably used in the second direction and slice-GRAPPA is preferably used in the third direction. The shift factor for simultaneous multislice acceleration is preferably ¼ of the field of view. For the sixth diagnostic scan Mb7, the number of reference lines used for calibration of GRAPPA and slice-GRAPPA, i.e. in second direction and third direction, is preferably between 30 and 60, most preferably between 40 and 50, particularly preferable 47. This combination of parameters proves an ideal trade-off for the sixth diagnostic scan Mb7, balancing image quality, in particular signal-to-noise ratio, blurring and contrast, and the sixth period for the sixth diagnostic scan Mb7. In particular, the use of Compressed Sensing acceleration technology is conceivable as an alternative or in addition to the previously presented acceleration methods.

The aforementioned parameters concerning the magnetic resonance sequence to the sixth diagnostic scan Mb7 are advantageously selected such that the sixth diagnostic measurement data can be recorded in full with the magnetic resonance sequence used in less than 120 seconds, in particular in less than 100 seconds, advantageously in less than 80 seconds and most advantageously in less than 72 seconds. First image data reconstructed from the first diagnostic measurement data can be reconstructed and provided for diagnosis immediately after completion of the sixth diagnostic scan Mb7.

The seventh measuring block Bb7, in particular the sixth diagnostic scan Mb7, can be preferably used with a magnetic resonance device which has a main magnetic field with 1.5 Tesla. The specified ranges of the areas for parameters which are specified in the description of the seventh measuring block Bb7 for 3 Tesla are typically also applicable to other configurations. If the sixth diagnostic scan Mb7 is performed with a magnetic resonance device which has a main magnetic field with 1.5 Tesla, in particular the repetition time, the echo time, the bandwidth of the frequency coding, phase oversampling or the number of echo trains per measurement layer may change, specifically:

the bandwidth selected for frequency coding is preferably in the range of between 200 Hertz per pixel and 300 Hertz per pixel, preferably 249 Hertz per pixel the number of voxels per measurement layer in the first direction is preferably reduced from 384 to 352 the spatial expansion of the recording area in a measurement layer in a first direction may be reduced according to the number of voxels such that the size of a voxel in first direction remains constant.

Recording Parameter Ratio Between Diagnostic Scans

The ratios of the recording parameters between the diagnostic scans Ba1, Ba2, Ba3, Ba4, Ba5, Ba6 of the first knee imaging also apply to the ratios of the recording parameters between the diagnostic scans Bb1, Bb2, Bb3, Bb4, Bb5, Bb6 of the second knee imaging.

The seventh period of the sixth diagnostic scan Mb7 is preferably longer than the average of all periods of the diagnostic scans Mb2-Mb7. The sum of the durations of the measurement blocks Bb2, Bb6 acquiring measurement data with a sagittal layer orientation is preferably longer than the sum of the durations of the measurement blocks Bb3, Bb5 acquiring measurement data with a coronal layer orientation. The sum of the durations of the measurement blocks Bb2, Bb6 acquiring measurement data with a sagittal layer orientation is preferably longer than the sum of the durations of the measurement blocks Bb4, Bb7 acquiring measurement data with an axial layer orientation.

Preferably, the resolution within a measurement layer of the first diagnostic scan Mb2 and the sixth diagnostic scan Mb7 differ by less than 10%. Preferably, the resolution within a measurement layer of the first diagnostic scan Mb2 and/or the sixth diagnostic scan Mb7 is higher than the resolution within a measurement layer of any of the diagnostic scans Mb2-Mb6. Preferably, the resolution within a measurement layer of diagnostic scans generating PD-weighted image data is higher than the resolution within a measurement layer of diagnostic scans generating a different contrast than PD-weighting. The higher contrast of PD-weighted image data in high resolution enables a detailed diagnosis. The enhanced signal-to-noise ratio of PD-weighted image data compared to different contrasts than PD-weighting can be balanced by the use of higher resolution. The recording parameters of the first diagnostic scan Mb2 and the sixth diagnostic scan Mb7 provide an optimal balance between signal-to-noise ratio and resolution to provide best image data for diagnosis of a large variety of diseases and pathologies.

The sixth diagnostic scan Mb7 is preferably the only scan of all diagnostic scans Mb2-Mb7, where the second direction preferably connects an anterior and a posterior position of the knee of the examination object. The resulting combination of direction of phase coding, contrast and field of view provides least artifacts. Particularly, folding artifacts in direction of phase coding are mitigated due to the anatomy of the knee of the examination object. Even little phase oversampling, as provided in the section of the recording parameters of measuring block Bb7 is sufficient to avoid folding artifacts, even in case the spatial expansion of the field of view in second direction is reduced.

General Remarks Concerning FIG. 1 and FIG. 2

The measurement data recorded in a measuring block Ba, Bb is preferably reconstructed as image data and made available to the user on the display unit and/or stored in a database. The measurement data can also be stored in a database. In order to be able to record meaningful diagnostic measurement data in the maximum specified imaging period, different acceleration technologies and/or automation techniques are used for the presented procedures for knee imaging. Hereinafter some of the acceleration technologies and automation techniques used for knee imaging are presented. The presented techniques can be used individually as well as combined. Some techniques presented can be applied to both the first knee imaging and the second knee imaging.

Reduction of User Interactions

Knee imaging shall comprise the first knee imaging shown in FIG. 1 or the second knee imaging shown in FIG. 2. A maximum of one user interaction takes place during the knee imaging.

The number of diagnostic scans during knee imaging is in particular greater and particularly advantageously at least five times as great as the number of user interactions during knee imaging. Furthermore, during knee imaging at least the same number of automatic evaluation steps as user interactions takes place advantageously. Preferably, during knee imaging, the number of automatic evaluation steps is greater than the number of user interactions.

The number of user interactions is advantageously reduced by appropriate automation measures during knee imaging. Measurement parameters such as, for example, layer positioning and/or shim volume can be automatically copied between different measuring blocks. Voice commands can also be issued automatically to the examination object, for example, for the administration of contrast agent and/or the administration of the contrast agent itself can take place automatically so that the user does not have to concentrate on it during the performance of knee imaging. At the same time, the protocol used for knee imaging can be dynamically adjusted to patient-specific features. Thus, a recording area for the diagnostic measurement data can be automatically ascertained on the basis of a patient value and/or the overview measurement data.

At the same time, it is advantageous that at the points in knee imaging at which a user interaction Ia, Ib is required, the user is advantageously given an instruction for the respective user interaction directly on the display unit. Advantageously, proposals are already submitted to the user automatically and it only remains for him to accept or amend them. At the same time, for a necessary user interaction directly appropriate tools are advantageously displayed to the user for the performance of the user interaction. In such a way, the user can be led through the workflow during knee imaging. The time required for the user interaction can be reduced by the user guidance for the user interaction. The usual time for the user interaction Ia, Ib may in this way be half a minute maximum, advantageously 20 seconds maximum, particularly advantageously 10 seconds maximum and most advantageously 5 seconds maximum.

Overall, the renunciation by and large of user interactions compared to traditional examinations of the knee which advantageously only take place at the start of knee imaging makes it possible to accelerate the sequence of knee imaging such that the acquisition of diagnostic measurement data required for the assessment of the knee of the examination object in the maximum imaging period is enabled. The evaluation of the overview measurement data in the evaluation step Ea1, Eb1 also takes place automatically particularly advantageously.

The reduction of the number of necessary user interactions can result in a reduced requisite imaging period for knee imaging. The operation of knee imaging is also particularly user-friendly as a result. The results of knee imaging can be particularly robust as they are less susceptible to user errors. The intelligent ranking of the user interactions in the sequence of knee imaging can therefore improve the technical reliability of the sequence of knee imaging. At the same time, diagnostic measurement data standardized in this way can be acquired in knee imaging. An imaging period for knee imaging is also standardized and can therefore be well predicted. This can lead to improved planning of the utilization of the magnetic resonance device.

The use of acceleration technology such as, for example, parallel imaging, simultaneous multislice, partial Fourier technique and/or Compressed Sensing can enable a recording of the diagnostic measurement data in a particularly short recording time. Particularly in a comprehensive diagnosis of the knee, the employment of acceleration technology can be particularly useful due to the large amount of recording time usually required. In addition, the influence of the movement of the examination object on the diagnostic magnetic resonance measurement data can be significantly reduced. The use of an acceleration technology can also enable the robust acquisition of diagnostic magnetic resonance measurement data in the case of an uncooperative patient or children.

FIG. 3—a Magnetic Resonance Device

FIG. 3 shows a diagrammatic view of a magnetic resonance device 11 according to an example embodiment for the performance of knee imaging in accordance with FIG. 1-FIG. 2. The magnetic resonance device 11 comprises a detector unit formed by a magnet unit 13 with a main magnet 17 for the generation of a strong and particularly constant main magnetic field 18. In addition, the magnetic resonance device 11 has a cylindrical patient receiving area 14 for receiving an examination object 15, in the present case a patient, wherein the patient receiving area 14 is cylindrically enclosed in one peripheral direction of the magnet unit 13. The patient 15 can be pushed into the patient receiving area 14 by the patient positioning device 16 of the magnetic resonance device 11. The patient positioning device 16 has a couch for this purpose which can be moved inside the magnetic resonance device 11. The magnet unit 13 is shielded to the outside by the housing cover 31 of the magnetic resonance device.

Furthermore, the magnet unit 13 has a gradient coil unit 19 for the production of magnetic field gradients which is used for spatial encoding during imaging. The gradient coil unit 19 is controlled by a gradient control unit 28. In addition, the magnet unit 13 has a high-frequency antenna unit 20 which in the case shown is designed as a body coil permanently integrated into the magnetic resonance device 11, and a high-frequency antenna control unit 29 for exciting polarization which sets itself in the main magnetic field 18 produced by the main magnet 17. The high-frequency antenna unit 20 is controlled by the high-frequency antenna control unit 29 and radiates high frequency magnetic resonance sequences into an area under examination essentially formed by the patient receiving area 14. Furthermore, the high-frequency antenna unit 20 is designed to receive magnetic resonance signals, in particular from the patient 15.

The magnetic resonance device 11 preferably has a local coil unit 12, which is designed to accommodate one knee of the patient. The local coil unit 12 preferably comprises a high-frequency antenna receive unit designed to receive magnetic resonance signals, in particular from the knee of the patient 15. The local coil unit 12 preferably comprises a high-frequency antenna transmit unit controlled by the high-frequency antenna control unit 29 and configured to radiate high frequency magnetic resonance sequences into an area under examination essentially formed by the area enclosed by the local coil unit 12. The local coil unit 12, preferably the high-frequency antenna transmit unit, is typically configured to radiate circularly polarized high frequency fields. The high-frequency antenna transmit unit and the high-frequency antenna receive unit may be separate from each other. The high-frequency antenna transmit unit and the high-frequency antenna receive unit may be integrated in one antenna and/or antenna system. The local coil unit 12 may be non-permanently attached to the patient positioning device 16.

The magnetic resonance device 11 has a computing unit 24 to control the main magnet 17, the gradient control unit 28 and the high-frequency antenna control unit 29. The computing unit 24 controls the magnetic resonance device 11 centrally, for example, the performance of a predetermined imaging gradient echo sequence. Control information such as, for example, imaging parameters and reconstructed magnetic resonance images can be made available to a user on a display unit 25 of the magnetic resonance device 11. In addition, the magnetic resonance device 11 has an input unit 26 by which information and/or parameters can be input by a user during a measurement procedure. The computing unit 24 may comprise the gradient control unit 28 and/or the high-frequency antenna control unit 29 and/or the display unit 25 and/or the input unit 26.

Furthermore, the magnetic resonance device 11 comprises a measurement data acquisition unit 32. The measurement data acquisition unit 32 in the present case is formed by the magnet unit 13 together with the high-frequency antenna control unit 29 and the gradient control unit 28. The magnetic resonance device 11 together with the measurement data acquisition unit 32 and the computing unit 24 is therefore designed for performing a method according to some example embodiments.

The magnetic resonance device 11 shown may, of course, include other components usually found in magnetic resonance devices 11. In addition, a general function of a magnetic resonance device 11 is known to a person skilled in the art so that there is no need for a detailed description of the other components.

FIG. 4—the Selection System

FIG. 4 shows a selection system 100 which enables a user to select the knee imaging to be performed. The selection system 100 comprises a user interface by which the user can select the knee imaging to be performed. For this the user interface comprises a sample unit 101 and an output unit 102. The sample unit can, in particular, be designed as an input unit 26 of the magnetic resonance device in accordance with FIG. 3. The output unit 102 can, in particular, be designed as a display unit 25 of the magnetic resonance device 11 in accordance with FIG. 4. In certain cases, it is also conceivable that the selection system 100 shown in FIG. 4 is separate from the magnetic resonance device 11.

The various knee imaging choices for selection are shown on the output unit 102, in particular together with or on a suitable button H1, H2. In the case shown in FIG. 4, the first knee imaging which is described in FIG. 1 is assigned to a first button H1 of the output unit 102, and the second knee imaging which is described in FIG. 2 is assigned to a second button H2 of the output unit 102.

The depiction of the buttons H1, H2 and the associated inscription can be designed in a manner deemed appropriate to a person skilled in the art. The buttons H1, H2 can, for example, be inscribed with the diagnostic options of the respectively assigned knee imaging. Thus, for example, the first button H1 can be inscribed such that the associated first knee imaging is designed for the fast assessment of the anatomy and/or pathology of the knee of the examination object. The second button H2 can be inscribed such that the associated second knee imaging is designed a fast and comprehensive assessment of the anatomy and/or pathology of the knee of the examination object. Furthermore, the maximum imaging period of the assigned knee imaging can be displayed on the buttons H1, H2 respectively.

With the sample unit 101, the user can thus select a button H1, H2 in order to select the associated knee imaging to be performed. In this way, the user can select the first knee imaging to be performed by activating the first button H1 and the second knee imaging to be performed by activating the second button H2. The selection of the button can be made by a method deemed appropriate by a person skilled in the art, for example, by a click, a double click, a drag & drop action, etc.

Naturally, other imaging procedures can also be displayed on the output unit 102, possibly also from other areas of the body of the examination object, and made available to the user for selection. The buttons H1, H2 can be arranged in a larger log tree which comprises other imaging procedures for selection.

After selection of a button H1, H2 by the user of the sample unit 101, the associated knee imaging can be started. In this way, information about the selection of the button H1, H2 can be transferred from the selection system 100 to the magnetic resonance device 11. The selection of the button H1, H2 can immediately trigger the start of the associated knee imaging. Advantageously, however, the entry of patient-specific features for respective knee imaging is first made possible for the user before knee imaging starts.

Naturally it is also conceivable that at least one additional diagnostic scan is introduced into the presented knee imaging. This can result in an extension of the imaging period of the respective knee imaging. The possible additional at least one diagnostic scan may, for example, comprise functional knee imaging.

Although some example embodiments were illustrated and described in detail by the preferred exemplary embodiments, nevertheless example embodiments are not restricted by the examples disclosed and other variations can be derived by a person skilled in the art, without departing from the scope of example embodiments.

The invention claimed is:

1. A method for recording diagnostic measurement data of a knee of an examination object in knee imaging by a magnetic resonance device, the method comprising:
performing an overview scan of the knee of the examination object, wherein overview measurement data is acquired in the overview scan,
performing diagnostic scans of the knee of the examination object based on the acquired overview measurement data, wherein two-dimensional diagnostic measurement data is acquired in the diagnostic scans and a number of diagnostic scans is at least five and at least four of the at least five diagnostic scans have a repetition time of at least five times more than a repetition time of another of the at least five diagnostic scans.

2. The method as claimed in claim 1, wherein the knee imaging comprises a single interaction of a user.

3. The method as claimed in claim 1, wherein at least one measurement layer is different in each of the diagnostic scans.

4. The method as claimed in claim 1, wherein any two diagnostic scans of the diagnostic scans differ in at least contrast or layer orientation.

5. The method as claimed in claim 1, wherein based on the overview measurement data for the diagnostic scans, parameters and/or adjustments are determined individually for the examination object in an evaluation step.

6. The method as claimed in claim 1, wherein recording parameters of the diagnostic scans and the overview scan are coordinated in such a way that the knee imaging is concluded within an imaging period of a maximum of 7 minutes.

7. The method as claimed in claim 6, wherein the examination object only remains in the magnetic resonance device during the imaging period.

8. The method as claimed in claim 1, wherein each diagnostic scan has a different contrast or a different layer orientation.

9. The method as claimed in claim 1, wherein at least two diagnostic scans of the diagnostic scans have a contrast with fat suppression.

10. The method as claimed in claim 1, wherein at least one diagnostic scan of the diagnostic scans comprises use of a local coil unit for radiation of high frequency fields.

11. The method as claimed in claim 10, wherein the high frequency fields radiated by the local coil unit are circularly polarized.

12. The method as claimed in claim 1, wherein at least two diagnostic scans of the diagnostic scans are accelerated by a technique combining acceleration within a measurement layer and acceleration perpendicular to the measurement layer.

13. The method as claimed in claim 12, wherein the acceleration within the measurement layer is achieved by subsampling and parallel imaging.

14. The method as claimed in claim 12, wherein the acceleration perpendicular to the measurement layer is achieved by simultaneous multislice imaging.

15. The method as claimed in claim 1, wherein at least two diagnostic scans of the diagnostic scans are accelerated by an acceleration factor of at least 4.

16. A magnetic resonance device comprising a measurement data acquisition unit and a computing unit, wherein the magnetic resonance device is configured to perform the method of claim 1.

17. A non-transitory computer readable medium, when executed by a programmable computing unit of a magnetic resonance device, configured to cause the magnetic resonance device to perform the method of claim 1.

18. The method as claimed in claim 1, wherein at least three of the at least five diagnostic scans have a turbo factor, the turbo factors of the three of the at least five diagnostic scans differs by less than 20 percent.

19. The method as claimed in claim 1, wherein recording parameters of at least four of the at least five diagnostic scans and the overview scan are coordinated in such a way that the knee imaging is concluded within an imaging period of a maximum of 7 minutes.

20. The method as claimed in claim 1, wherein recording parameters of the diagnostic scans and the overview scan are coordinated in such a way that the knee imaging is concluded within an imaging period of a maximum of 7 minutes and at least one diagnostic scan of the diagnostic scans comprises use of a local coil unit for radiation of high frequency fields.

21. A method for recording diagnostic measurement data of a knee of an examination object in knee imaging by a magnetic resonance device, the method comprising:
performing an overview scan of the knee of the examination object, wherein overview measurement data is acquired in the overview scan,
performing diagnostic scans of the knee of the examination object based on the acquired overview measurement data, wherein two-dimensional diagnostic measurement data is acquired in the diagnostic scans and a number of diagnostic scans is at least five and at least three of the at least five diagnostic scans have a turbo factor, the turbo factors of the three of the at least five diagnostic scans differs by less than 20 percent.

* * * * *